US006984861B2

(12) United States Patent
Yamada et al.

(10) Patent No.: US 6,984,861 B2
(45) Date of Patent: Jan. 10, 2006

(54) SEMICONDUCTOR MEMORY DEVICE HAVING A FERROELECTRIC CAPACITOR

(75) Inventors: Yuki Yamada, Yokohama (JP); Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/679,152

(22) Filed: Oct. 6, 2003

(65) Prior Publication Data
US 2005/0023589 A1    Feb. 3, 2005

(30) Foreign Application Priority Data
Jul. 28, 2003    (JP) .............................. 2003-202536

(51) Int. Cl.
*H01L 27/108*    (2006.01)
(52) U.S. Cl. .................. 257/306; 257/295; 257/296; 257/311
(58) Field of Classification Search ........ 257/295–296, 257/306, 311, E27.084–E27.088
See application file for complete search history.

(56) References Cited
U.S. PATENT DOCUMENTS

| | | | | |
|---|---|---|---|---|
| 5,350,705 A | * | 9/1994 | Brassington et al. | 257/295 |
| 5,990,507 A | * | 11/1999 | Mochizuki et al. | 257/295 |
| 6,151,243 A | * | 11/2000 | Kim | 365/145 |
| 6,249,014 B1 | * | 6/2001 | Bailey | 257/295 |
| 6,303,958 B1 | | 10/2001 | Kanaya et al. | 257/310 |
| 6,313,491 B1 | * | 11/2001 | Shuto | 257/295 |
| 6,316,801 B1 | | 11/2001 | Amanuma | 257/306 |
| 6,438,019 B2 | * | 8/2002 | Hartner et al. | 365/133 |
| 6,534,810 B2 | * | 3/2003 | Baek | 257/296 |
| 6,734,477 B2 | * | 5/2004 | Moise et al. | 257/295 |
| 2002/0036305 A1 | * | 3/2002 | Sameshima | 257/295 |
| 2003/0013210 A1 | * | 1/2003 | Ramesh | 438/3 |
| 2003/0132472 A1 | * | 7/2003 | Koizumi | 257/296 |

FOREIGN PATENT DOCUMENTS

| | | | |
|---|---|---|---|
| JP | 04092469 A | * | 3/1992 |
| JP | 11-317500 | | 11/1999 |
| JP | 2001-267520 | | 9/2001 |

\* cited by examiner

*Primary Examiner*—Allan R. Wilson
(74) *Attorney, Agent, or Firm*—Oblon, Spivak, McClelland, Maier & Neustadt, P.C.

(57) ABSTRACT

A semiconductor memory device includes a semiconductor substrate, a transistor formed on the semiconductor substrate, and having a gate electrode and first and second diffusion layers, a first insulating film formed on the transistor, a first multi-layer interconnect layer formed in the first insulating film, and including a plurality of interconnect layers and contacts, a first recessed portion formed to continuously and vertically penetrate the first insulating film including at least two layers of the first multi-layer interconnect layer, and arranged so that at least part of the first recessed portion overlaps with the gate electrode, and a ferroelectric capacitor three-dimensionally formed in the first recessed portion, and having first and second electrodes and a ferroelectric film, the first electrode being electrically connected with the first diffusion layer.

21 Claims, 40 Drawing Sheets

SEMICONDUCTOR MEMORY DEVICE HAVING A FERROELECTRIC CAPACITOR

CROSS-REFERENCE TO RELATED APPLICATIONS

This application is based upon and claims the benefit of priority from the prior Japanese Patent Application No. 2003-202536, filed Jul. 28, 2003, the entire contents of which are incorporated herein by reference.

BACKGROUND OF THE INVENTION

1. Field of the Invention

The present invention relates to a semiconductor memory device having a ferroelectric capacitor and a method manufacturing the same.

2. Description of the Related Art

Recently, various memories have been developed; for example, a ferroelectric memory having ferroelectric capacitor and a dynamic random access memory (DRAM) having high dielectric capacitor are given as a semiconductor memory. In these ferroelectric memory and DRAM, the memory cell includes a selector transistor and a capacitor functioning as memory element connected to the selector transistor (e.g., JPN. PAT. APPLN KOKAI Publication No. 11-317500).

According to the conventional technique, after multi-layer interconnects of peripheral circuit and memory cell sections are formed, a capacitor of the memory cell section is formed. By doing so, the capacitor is formed at the uppermost layer. In this case, multi-layer interconnects are formed without being hindered by the capacitor, and also, capacitor degradation is prevented.

On the other hand, the multi-layer interconnects are formed after the capacitor is previously formed, and thereby, the capacitor is formed at the lower layer. In also case, the multi-layer interconnects are formed without being hindered by the capacitor, like the case described above, and there is no limitation of thermal process in forming the capacitor.

However, these advantages described above are obtained when the capacitor has two-dimensional structure, and is not so high. In this case, the capacitor having two-dimensional structure (hereinafter, referred to as two-dimensional capacitor) has the following structure. According to the structure, an electrode layer constituting the capacitor extends to only X and Y directions, that is, on the plane, and does not three-dimensionally extend to the Z direction.

In ferroelectric memory and DRAM, the technique of combining a three-dimensionally structural capacitor and multi-layer interconnects is required in order to realize high integration. In this case, the three-dimensionally structural capacitor (hereinafter, referred to as three-dimensional capacitor) has the following structure. According to the structure, an electrode layer constituting the capacitor does not only extend to X and Y directions, that is, on the plane, but also three-dimensionally extends to the Z direction.

However, if the structure according to the conventional technique is intactly applied to the three-dimensional capacitor, there is the following problem. More specifically, when the capacitor and multi-layer interconnects are formed in different layer, cell is enlarged because the three-dimensional capacitor has the height larger high than the two-dimensional capacitor.

BRIEF SUMMARY OF THE INVENTION

According to a first aspect of the present invention, there is provided a semiconductor memory device comprising: a semiconductor substrate; a transistor formed on the semiconductor substrate, and having a gate electrode and first and second diffusion layers; a first insulating film formed on the transistor; a first multi-layer interconnect layer formed in the first insulating film, and including a plurality of interconnect layers and contacts; a first recessed portion formed to continuously and vertically penetrate the first insulating film including at least two layers of the first multi-layer interconnect layer, and arranged so that at least part of the first recessed portion overlaps with the gate electrode; and a ferroelectric capacitor three-dimensionally formed in the first recessed portion, and having first and second electrodes and a ferroelectric film, the first electrode being electrically connected with the first diffusion layer.

According to a second aspect of the present invention, there is provided a method of manufacturing a semiconductor memory device, comprising: forming a transistor having a gate electrode and first and second diffusion layers on a semiconductor substrate; forming a first insulating film on the transistor; forming a first multi-layer interconnect layer including a plurality of interconnect layers and contacts in the first insulating film; forming a first recessed portion continuously and vertically penetrating the first insulating film including at least two layers of the first multi-layer interconnect layer at a position such that at least part of the first recessed portion overlaps with the gate electrode; successively forming first electrode, ferroelectric film and second electrode in the first recessed portion; and patterning the first electrode, ferroelectric film and second electrode so that a three-dimensional ferroelectric capacitor can be formed in the first recessed portion.

DETAILED DESCRIPTION OF THE INVENTION

Figure 1:
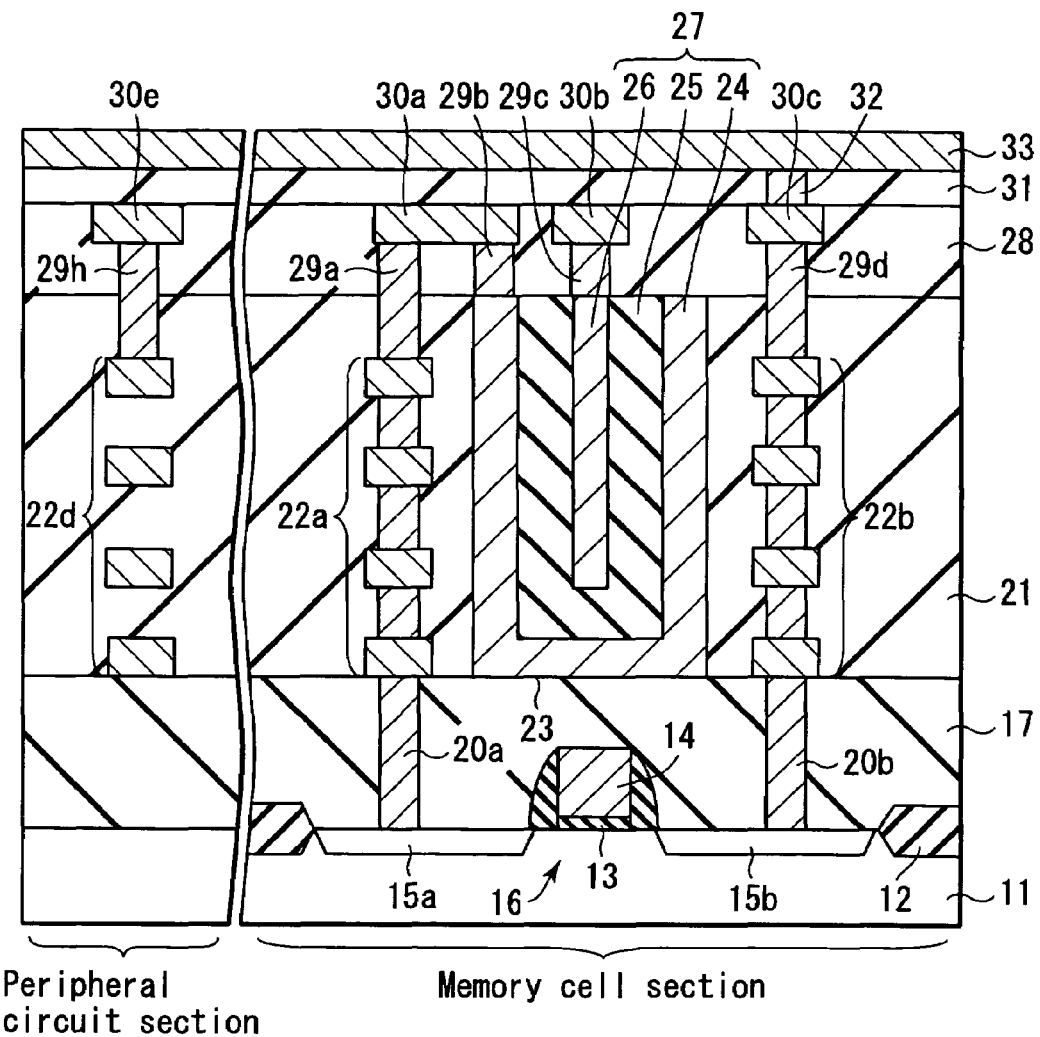
FIG. 1 is a cross-sectional view showing a semiconductor memory device of a basic example according to a first embodiment of the present invention.

Embodiments of the present invention will be described below with reference to the accompanying drawings. In the following description, the same reference numerals are used to designate common portions in all drawings.

Each embodiment will explain about the case where the present invention is applied to a ferroelectric memory. The present invention is also applicable to a dynamic random access memory (DRAM) having a high dielectric capacitor.

[1] First Embodiment

The first embodiment relates to the basic structure of each embodiment. More specifically, a three-dimensionally structural ferroelectric capacitor (hereinafter, referred to as three-dimensional ferroelectric capacitor) is arranged above a memory cell transistor. The three-dimensional ferroelectric capacitor and multi-layer interconnects are formed in the same insulating film. By doing so, it is possible to prevent cells from being enlarged when the three-dimensional ferroelectric capacitor is used.

In this case, the three-dimensional ferroelectric capacitor has the following structure. According to the structure, top electrode constituting ferroelectric capacitor, bottom electrode and ferroelectric film do not only extend to X and Y directions, that is, on the plane, but also three-dimensionally extends to the Z direction.

[1-1] Basic Example

FIG. 1 is a cross-sectional view showing a semiconductor memory device of a basic example according to a first embodiment of the present invention. The basic structure according to the first embodiment will be described below.

As shown in FIG. 1, a memory cell section of the first embodiment includes a memory cell transistor 16, a three-dimensional ferroelectric capacitor 27 arranged above the transistor 16, and multi-layer interconnect layers 22a and 22b. One source/drain diffusion layer 15a of the transistor 16 is connected with a bottom electrode 24 of the ferroelectric capacitor 27 via the multi-layer interconnect layer 22a. The other source/drain diffusion layer 15b of the transistor 16 is connected with a bit line 33 via the multi-layer interconnect layer 22b. The memory cell section has the structure described below.

A gate electrode 14 is formed on a semiconductor substrate 11, and source/drain diffusion layers 15a and 15b are formed in the semiconductor substrate 11 via the gate electrode 14. In this manner, the memory cell transistor 16 is formed.

An interlayer insulating film 17 is formed on the transistor 16, and contacts 20a and 20b are formed in the interlayer insulating film 17. In this case, the contact 20a is connected to the source/drain diffusion layer 15a; on the other hand, the contact 20b is connected to the source/drain diffusion layer 15b.

An interlayer insulating film 21 is further formed on the interlayer insulating film 17 and contacts 20a, 20b. The interlayer insulating film 21 is formed with multi-layer interconnect layers 22a and 22b including a plurality of interconnect layers and contacts. In this case, the multi-layer interconnect layer 22a is connected to the contact 20a; on the other hand, the multi-layer interconnect layer 22b is connected to the contact 20b.

The interlayer insulating film 21 is formed with a recessed portion 23. The recessed portion 23 continuously and vertically penetrates through the interlayer insulating film 21 including multi-layer interconnect layers 22a and 22b. The recessed portion 23 is positioned above the gate electrode 14 of the transistor 16 so that it can overlap with the gate electrode.

The recessed portion 23 is formed with the three-dimensional ferroelectric capacitor 27. The three-dimensional ferroelectric capacitor 27 has a top electrode 26, a bottom electrode 24 and a ferroelectric film 25 between top and bottom electrodes 26 and 24.

An interlayer insulating film 28 is formed on the ferroelectric capacitor 27 and multi-layer interconnect layers 22a, 22b. The interlayer insulating film 28 is formed with contacts 29a to 29d and interconnects 30a to 30c. By doing so, the bottom electrode 24 of the ferroelectric capacitor 27 is electrically connected with the source/drain diffusion layer 15a via contact 29b, interconnect 30a, contact 29a, multi-layer interconnect layer 22a and contact 20a. On the other hand, the top electrode 26 of the ferroelectric capacitor 27 is electrically connected with the plate interconnect 30b via the contact 29c.

An interlayer insulating film 31 is formed on interconnects 30a to 30c and the interlayer insulating film 28. The interlayer insulating film 31 is formed with a contact 31. A bit line 33 is formed on these contact 32 and interlayer insulating film 31. The bit line 33 arranged above the capacitor 27 is electrically connected with the source/drain diffusion layer 15b via contact 32, interconnect 30c, contact 29d, multi-layer interconnect layer 22b and contact 20b.

Incidentally, the recessed portion 23 is not limited to the depth penetrating the region where all interconnect layers of multi-layer interconnect layers 22a and 22b exist. The recessed portion 23 may have the depth penetrating the region where at least two or more interconnect layers of multi-layer interconnect layers 22a and 22b exist. In other words, the recessed portion 23 may have any depth so long as the three-dimensional capacitor is formed.

In addition, the recessed portion 23 may be positioned over the gate electrode 14, and may be positioned to overlap with at least part of the gate electrode 14.

In addition, an aspect ratio of the recessed portion 23 is about 1 if the ferroelectric film 25 consisting of PZT is formed by sputtering process. The aspect ratio is about 4 to 5 if the ferroelectric film 25 consisting of PZT is formed by CVD (chemical Vapor Deposition) process. Here, the reason why the ferroelectric film 25 consisting of PZT is used as the film for forming the capacitor 27 is as follow. Because, the ferroelectric film 25 consisting of PZT is hard most to be buried in films for forming the capacitor 27. Incidentally, the aspect ratio of the recessed portion 23 can take various values by changing the basic material of the film.

A peripheral circuit section of the first embodiment has the structure in which multi-layer interconnect layer 22d, contact 29h and interconnect 30e are formed in interlayer insulating films 21 and 28. These multi-layer interconnect layer 22d, contact 29h and interconnect 30e consist of the same material as multi-layer interconnect layers 22a, 22b, contacts 29a, 29d, and interconnects 30a to 30c, and formed on the identical plane. Each interconnect layer of the multi-layer interconnect layer 22d may be connected via contact (not shown).

FIG. 2 to FIG. 7 are cross-sectional views showing the process of manufacturing the semiconductor memory device of the basic example according to the first embodiment of the present invention. The following is a description on the method of manufacturing the semiconductor memory device of the basic example according to the first embodiment.

Figure 2:
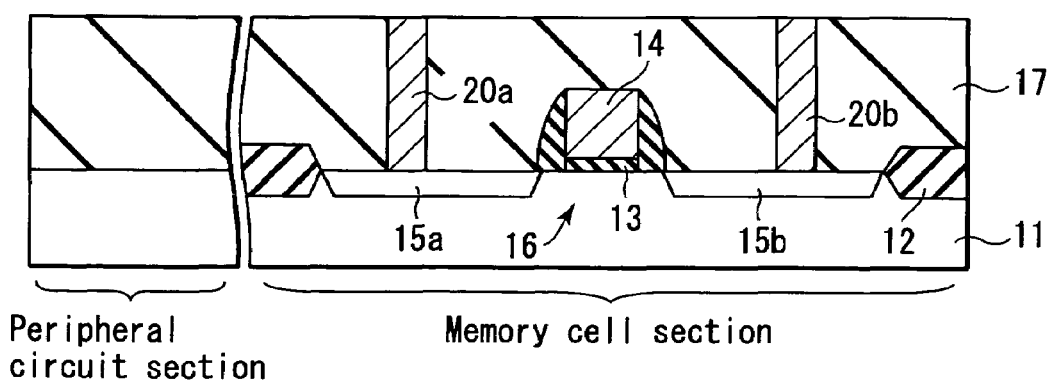
FIG. 2 to FIG. 7 are cross-sectional views showing the process of manufacturing the semiconductor memory device of the basic example according to the first embodiment of the present invention.

As shown in FIG. 2, an isolation region 12 for isolating an element region is formed in the semiconductor substrate 11. The gate electrode 14 is formed on the element region of the semiconductor substrate 11 via a gate insulating film 13, and source/drain diffusion layers 15a and 15b are formed in the element region 12. In this manner, the memory cell transistor 16 is formed.

A first interlayer insulating film 17 is formed on the transistor 16 by LP-CVD (Low Pressure-Chemical Vapor Deposition) or P-CVD process. The surface of the first interlayer insulating film 17 is planarized using CMP (Chemical Mechanical Polish). In this case, the first interlayer insulating film 17 consists of the following materials. For example, the materials are BPSG (Boron Phosphorous Silicate Glass), LP-TEOS (Tetra Ethyl Ortho Silicate) and DTEOS (Densified Tetra Ethyl Ortho Silicate).

The interlayer insulating film 17 is formed with contacts 20a and 20b, which are connected to source/drain diffusion layers 15a and 15b, respectively. These contacts 20a and 20b consist of materials such as W and Poly-Si. Incidentally, a barrier metal layer consisting of Ti and TiN may be formed before each hole of the contacts 20a and 20b are filled with contact material. By doing so, it is possible to suppress the reaction of source/drain diffusion layers 15a and 15b on the semiconductor substrate 11 with contacts 20a and 20b, and thus, to optimize these contacts 20a and 20b.

Figure 3:
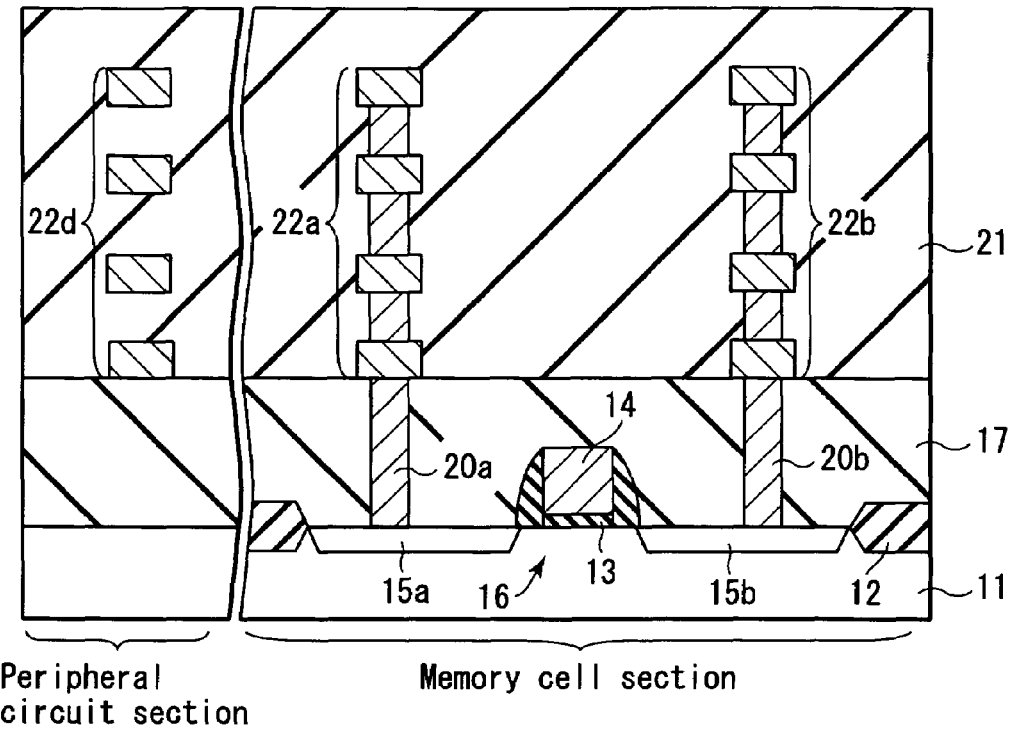

As illustrated in FIG. 3, in the second interlayer insulating film 21, multi-layer interconnect layers 22a, 22b and 22d are formed in memory cell section and peripheral circuit section. In this case, the second interlayer insulating film 21 consists of materials such as BPSG, LP-TEOS and DTEOS. The multi-layer interconnect layers 22a, 22b and 22d consist of materials such as W, Cu and Al.

Each interconnect layer of these multi-layer interconnect layers 22a, 22b and 22d is formed in the following method. For example, if the damascene process is employed, a trench is formed in the insulating film, and the trench is filled with interconnect material. Thereafter, the surface of the interconnect material is planarized, and thereby, an interconnect layer having damascene structure is formed. In addition, if RIE (Reactive Ion Etching) is employed, the interconnect material is formed on the entire surface. Thereafter, the interconnect material is patterned into a desired shape by RIE, and thereby, the interconnect layer is formed.

Figure 4:
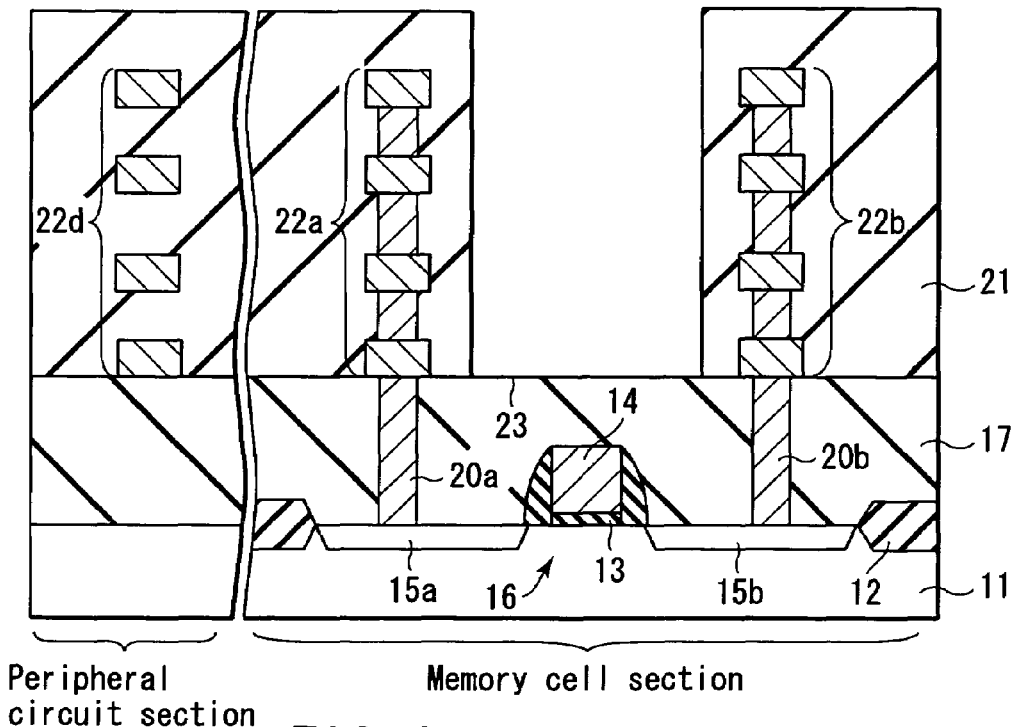

As depicted in FIG. 4, the second interlayer insulating film 21 is selectively etched using RIE so that the recessed portion 23 can be formed. The recessed portion 23 is formed so that it can be positioned above at least gate electrode 14.

Figure 5:
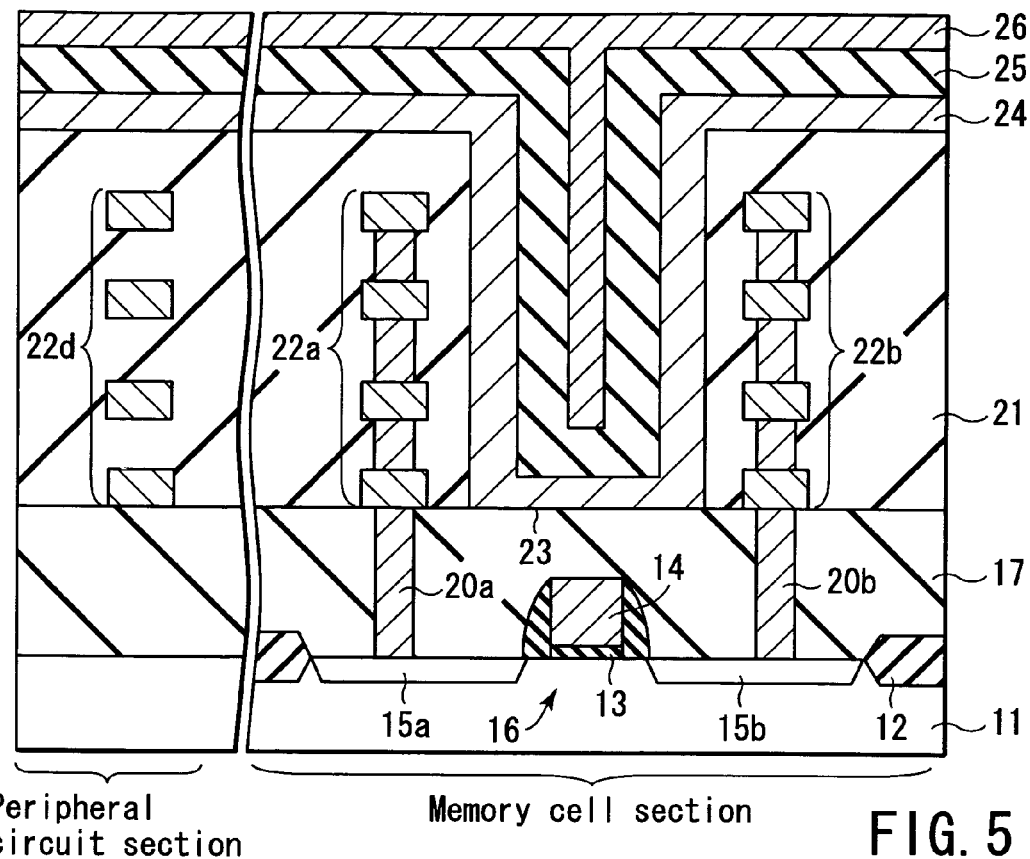

As seen from FIG. 5, bottom electrode 24, ferroelectric film 25 and top electrode 26 are successively deposited in the recessed portion 23 and on the second interlayer insulating film 21 by CVD or sputtering process. For example, Pt, Ir, $IrO_2$ and SRO are used as the material for bottom and top electrodes 24 and 26. In addition, PZT and SBT are used as the material for the ferroelectric film 25.

Figure 6:
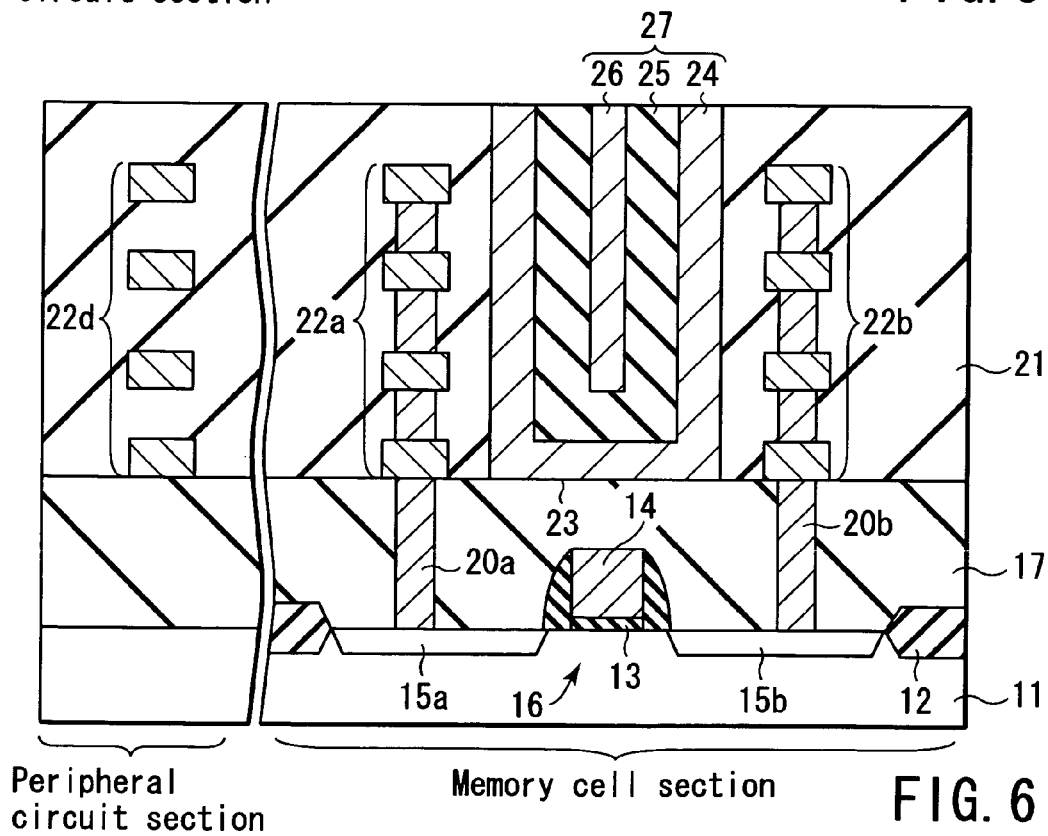

As shown in FIG. 6, the above-mentioned bottom electrode 24, ferroelectric film 25 and top electrode 26 are patterned using CMP and RIE so that the ferroelectric capacitor 27 can be formed.

Figure 7:
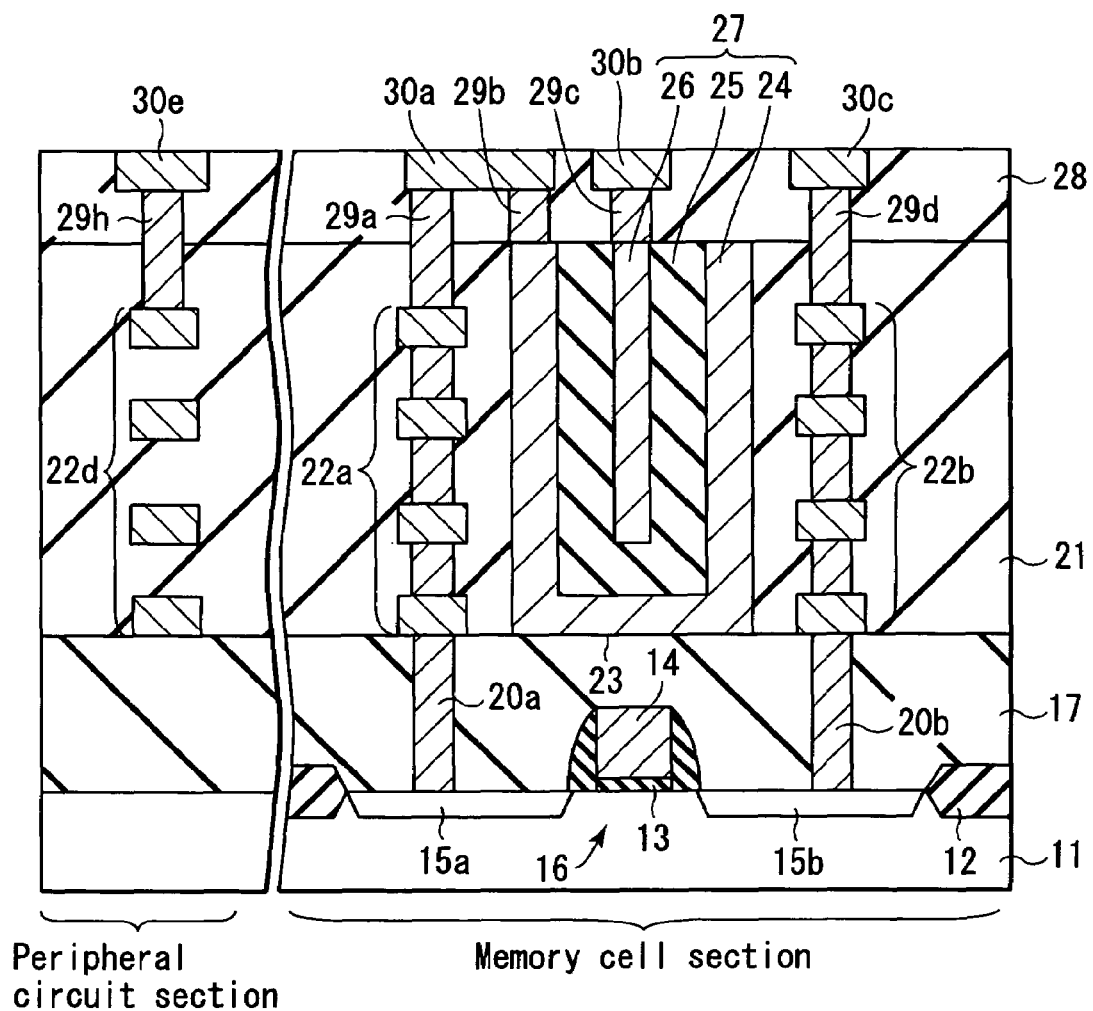

As illustrated in FIG. 7, the third interlayer insulating film 28 is deposited. The third interlayer insulating film 28 is formed with contacts 29a to 29d, 29h, interconnects 30a to 30c and 30e using damascene process and RIE.

As seen from FIG. 1, the fourth interlayer insulating film 31 is formed, and the contact 32 connected to the interconnect 30c is formed in the fourth interlayer insulating film 31. Thereafter, the bit line 33 is formed on the contact 32 and the fourth interlayer insulating film 31. In this manner, the basic structure of the first embodiment is formed.

According to the basic structure of the first embodiment, the three-dimensional ferroelectric capacitor 27 is arranged above the memory cell transistor 16. By doing so, the cell width is reduced in the direction parallel with the substrate. In addition, the three-dimensional ferroelectric capacitor 27 and the multi-layer interconnects are formed in the same layer. By doing so, the cell height is reduced in the direction vertical to the substrate. Therefore, it is possible to prevent the cell from being enlarged when the three-dimensional ferroelectric capacitor 27 is used.

If the conventional process is employed, the following problem arises because of using the three-dimensional capacitor 27 higher than the two-dimensional capacitor. Namely, the aspect ratio of the contact for connecting the bottom electrode 24 and the source/drain diffusion layer 15a becomes high. However, according to the first embodiment, the multi-layer interconnect layer 22a is used to electrically connect the bottom electrode 24 of the ferroelectric capacitor 27 and the source/drain diffusion layer 15a of the transistor 16. By doing so, the aspect ratio of each contact of the multi-layer interconnect layer 22a and the contact 29a is kept smaller than the following case. Namely, the aspect ratio is smaller as compared with the case where the interconnect 30a and the contact 20a or source/drain diffusion layer 15a are connected via one contact. Thus, the enlargement of cell can be reduced to the same degree as the conventional two-dimensional capacitor. As a result, high integration of memory cell can be realized.

Likewise, if the conventional process is employed, the following problem arises because of using the three-dimensional capacitor 27 higher than the two-dimensional capacitor. Namely, the aspect ratio of the contact for connecting the bit line 33 and the source/drain diffusion layer 15b becomes high. However, according to the first embodiment, the multi-layer interconnect layer 22b is used to electrically connect the bit line 33 and the source/drain diffusion layer 15b of the transistor 16. By doing so, the aspect ratio of each contact of the multi-layer interconnect layer 22b, contacts 29d and 32 is kept smaller than the following case. Namely, the aspect ratio is smaller as compared with the case where the bit line 33 and the contact 20b or source/drain diffusion layer 15b are connected via one contact. Thus, the enlargement of cell can be reduced to the same degree as the conventional two-dimensional capacitor. As a result, high integration of memory cell can be realized.

Multi-layer interconnect layers 22a and 22b of the memory cell section are formed simultaneously with the multi-layer interconnect layer 22d of the peripheral circuit section. Therefore, the conventional process of forming the multi-layer interconnect layer 22d of the peripheral circuit section is used without adding a new process of forming multi-layer interconnect layers 22a and 22b of the memory cell section.

The three-dimensional ferroelectric capacitor 27 and the multi-layer interconnect layers 22a; 22b are formed in the same layer (insulating film 21). By doing so, each aspect ratio of contacts 29a and 29d can be reduced as compared with the conventional case.

[1-2] Modification Example 1

According to the modification example 1 of the first embodiment, the basic structure of the first embodiment is additionally provided with a protection insulating film. More specifically, the protection insulating film having at least one function of stopper, hydrogen barrier and oxygen barrier is added when forming the recessed portioned portion for the ferroelectric capacitor.

Figure 8:
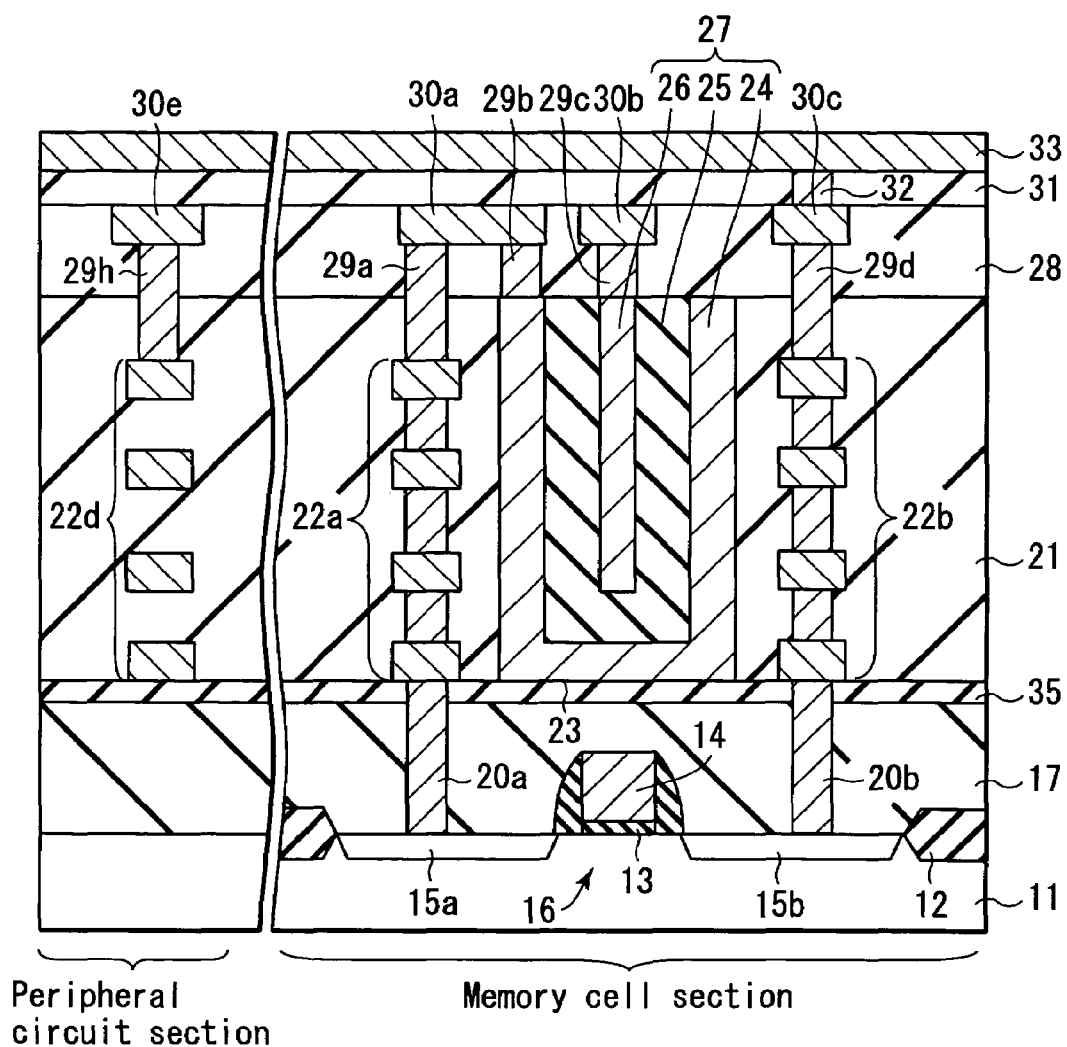
FIG. 8 is a cross-sectional view showing a semiconductor memory device of a modification example 1 according to the first embodiment of the present invention.

FIG. 8 is a cross-sectional view showing a semiconductor memory device of the modification example 1 according to the first embodiment of the present invention. The modification example 1 according to the first embodiment will be described below. Here, points different from the basic structure of the first embodiment will mainly described.

As seen from FIG. 8, the bottom surface of the recessed portion 23 is formed with a protection insulating film 35, which has at least one of stopper, hydrogen barrier and oxygen barrier functions. Preferably, the protection insulating film 35 is formed of material different from interlayer insulating films 17 and 21. For example, the protection insulating film 35 is formed of material containing any of SiN and $Al_2O_3$.

After the interlayer insulating film 17 is formed, the protection insulating film 35 is formed thereon. Contacts 20a and 20b are formed in the protection insulating film 35 and the interlayer insulating film 17. The interlayer insulating film 21 is formed with multi-layer interconnect layers 22a and 22b, and thereafter, the recessed portion 23 is formed in the interlayer insulating film 21. If the interlayer insulating film 21 is removed using the protection insulating film 35 as the stopper, the position of the bottom surface of the recessed portion 23 is determined by the protection insulating film 35.

According to the modification example 1 of the first embodiment, the following effect is obtained in addition to the same effect as the basic example of the first embodiment.

In the basic example of the first embodiment, the distance between the bottom surface of the recessed portion 23 and the upper surface of the gate electrode 14 must be kept in some degree. This is because of preventing over-etching to the gate electrode 14 in forming the recessed portion 23 above the transistor 16. For this reason, the distance is controlled according to etching time in the basic example.

On the contrary, according to the modification example, the distance between the bottom surface of the recessed portion 23 and the upper surface of the gate electrode 14 is controlled by the protection insulating film 35 in addition to etching time. Therefore, it is possible to improve the controllability of the distance between the bottom surface of the recessed portion 23 and the upper surface of the gate electrode 14. In addition, the protection insulating film 35 serves to obtain hydrogen and oxygen barrier effects.

[1-3] Modification Example 2

According to the modification example 2 of the first embodiment, the bit line of the basic example of the first embodiment is arranged below the capacitor.

Figure 9:
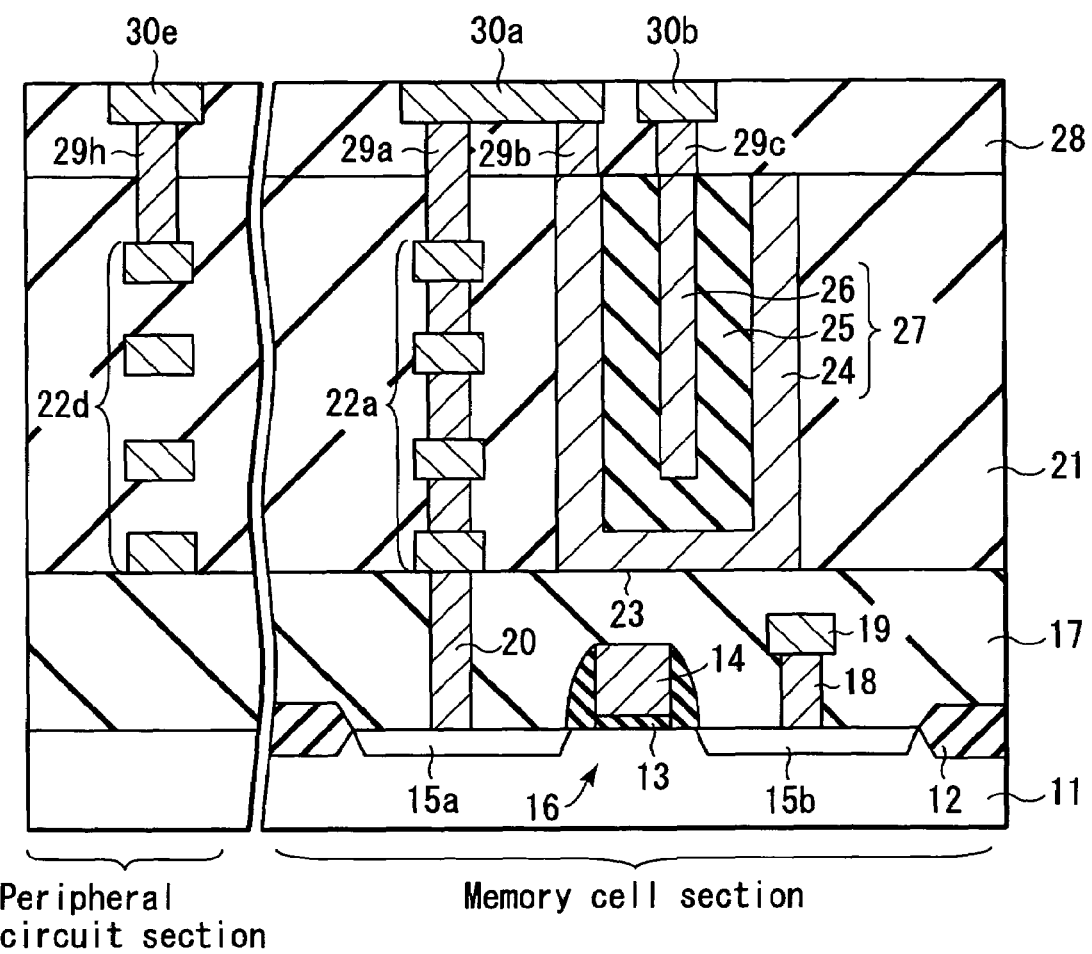
FIG. 9 is a cross-sectional view showing a semiconductor memory device of a modification example 2 according to the first embodiment of the present invention.

FIG. 9 is a cross-sectional view showing a semiconductor memory device of the modification example 2 according to the first embodiment of the present invention. The modification example 2 according to the first embodiment will be described below. Here, points different from the basic structure of the first embodiment will mainly described.

As illustrated in FIG. 9, a bit line 19 is formed in the first interlayer insulating film 17. The bit line 19 is connected to the source/drain diffusion layer 15b of the transistor 16 via a contact 18. In other words, the bit line 19 is arranged below the bottom surface of the capacitor 27. Preferably, the bit line 19 is located below the capacitor 27 and at the region provided with no transistor 16 in order to reduce the cell area.

According to the modification example 2 of the first embodiment, the following effect is obtained in addition to the same effect as the basic example of the first embodiment.

In the basic example of the first embodiment, the bit line 33 is arranged above the upper most surface of the capacitor 27. In this case, the cell size is made small in principle; however, the region capable of forming the capacitor 27 is limited by multi-layer interconnect layers 22a and 22b. As a result, there is a problem that misalignment of the capacitor 27 is easy to occur.

On the contrary, according to the modification example 2, the bit line 19 is arranged below the bottom surface of the capacitor 27. In this case, there is no possibility that misalignment of the capacitor 27 occurs.

[1-4] Modification Example 3

According to the modification example 3 of the first embodiment, the basic structure of the first embodiment is applied to a TC parallel unit series-connection ferroelectric memory. Here, the TC parallel unit series-connection ferroelectric memory means the following memory. The memory has the configuration in which both terminals of a capacitor (C) are connected between source/drain of a memory cell transistor (T) so that one unit cell can be formed, and several unit cells are connected in series.

Figure 10:
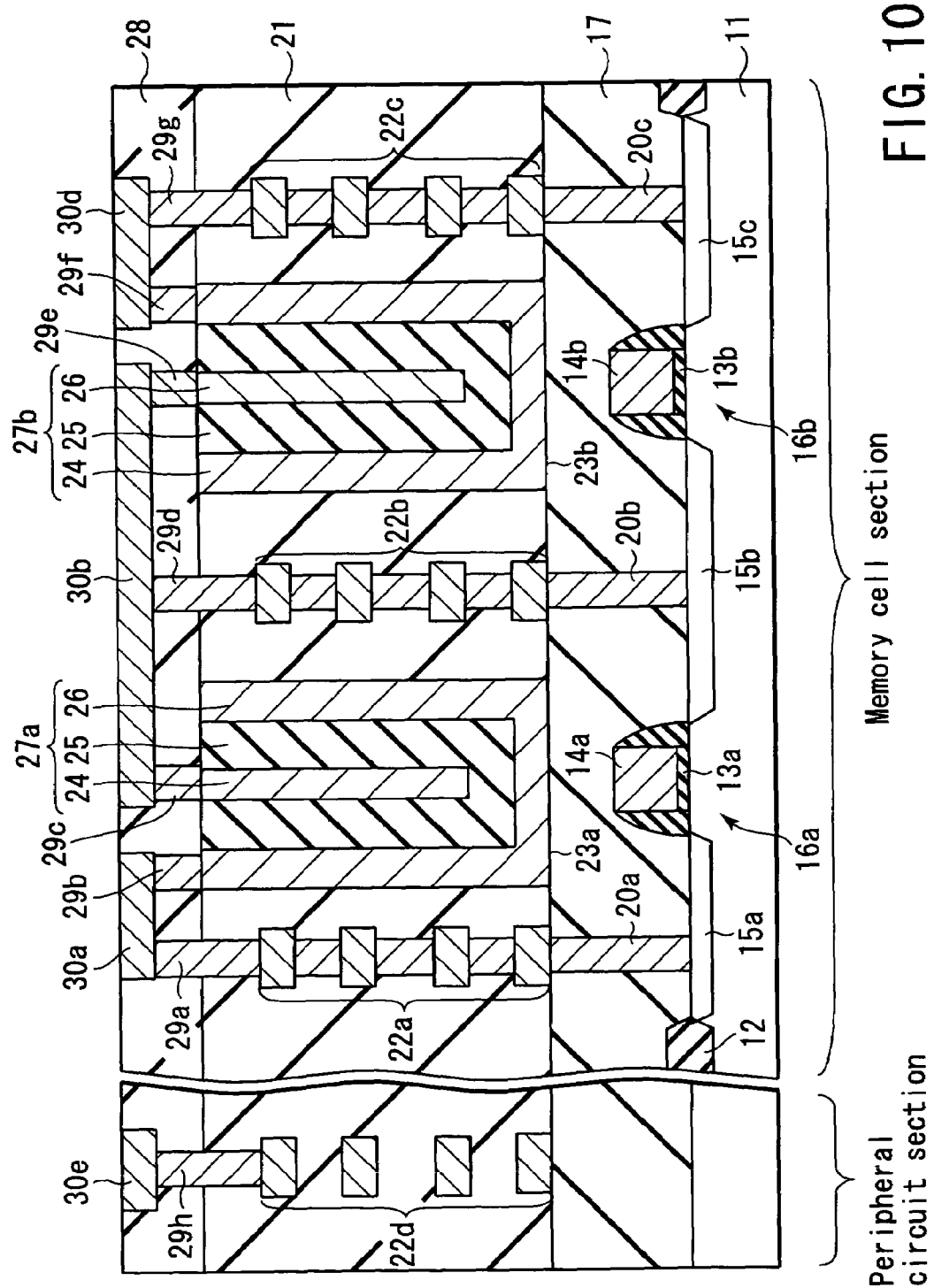
FIG. 10 is a cross-sectional view showing a semiconductor memory device of a modification example 3 according to the first embodiment of the present invention.

FIG. 10 is a cross-sectional view showing a semiconductor memory device of the modification example 3 according to the first embodiment of the present invention. The modification example 3 according to the first embodiment will be described below. Here, points different from the basic structure of the first embodiment will mainly described.

As shown in FIG. 10, both terminals of a first three-dimensional ferroelectric capacitor 27a are connected between source/drain of a first transistor 16a so that a first cell can be formed. In addition, both terminals of a second three-dimensional ferroelectric capacitor 27b are connected between source/drain of a second transistor 16b so that a second cell can be formed. These first and second cells are connected in series, and thus, TC parallel unit series-connection structure is formed.

In the first cell, one source/drain diffusion layer 15a of the transistor 16a is electrically connected with the bottom electrode 24 of the capacitor 27a via multi-layer interconnect layers 22a, contacts 20a, 29a, 29b and interconnect 30a. The other source/drain diffusion layer 15b of the transistor 16a is electrically connected with the top electrode 26 of the capacitor 27a via multi-layer interconnect layers 22b, contacts 20b, 29c, 29d and interconnect 30b.

In the second cell, one source/drain diffusion layer 15c of the transistor 16b is electrically connected with the bottom electrode 24 of the capacitor 27a via multi-layer interconnect layers 22c, contacts 20c, 29f, 29g and interconnect 30d. The other source/drain diffusion layer 15b of the transistor 16b is electrically connected with the top electrode 26 of the capacitor 27b via multi-layer interconnect layers 22b, contacts 20b, 29d, 29e and interconnect 30b.

Two transistors 16a and 16b use the source/drain diffusion layer 15b. In addition, two transistors 16a and 16b use multi-layer interconnect layers 22b, contacts 20b, 29d and interconnect 30b to make the connection between the source/drain diffusion layer 15b and each top electrode of the capacitors 27a and 27b. By doing so, the first and second cells are connected in series.

According to the modification example 3 of the first embodiment, the following effect is obtained in addition to the same effect as the basic example of the first embodiment. The TC parallel unit series-connection structure is formed, and thereby, the cell area can be reduced.

[2] Second Embodiment

The second embodiment relates to a modification example of the first embodiment. More specifically, the three-dimensional ferroelectric capacitor is surrounded with a hydrogen barrier film.

[2-1] Basic Example

Figure 11:
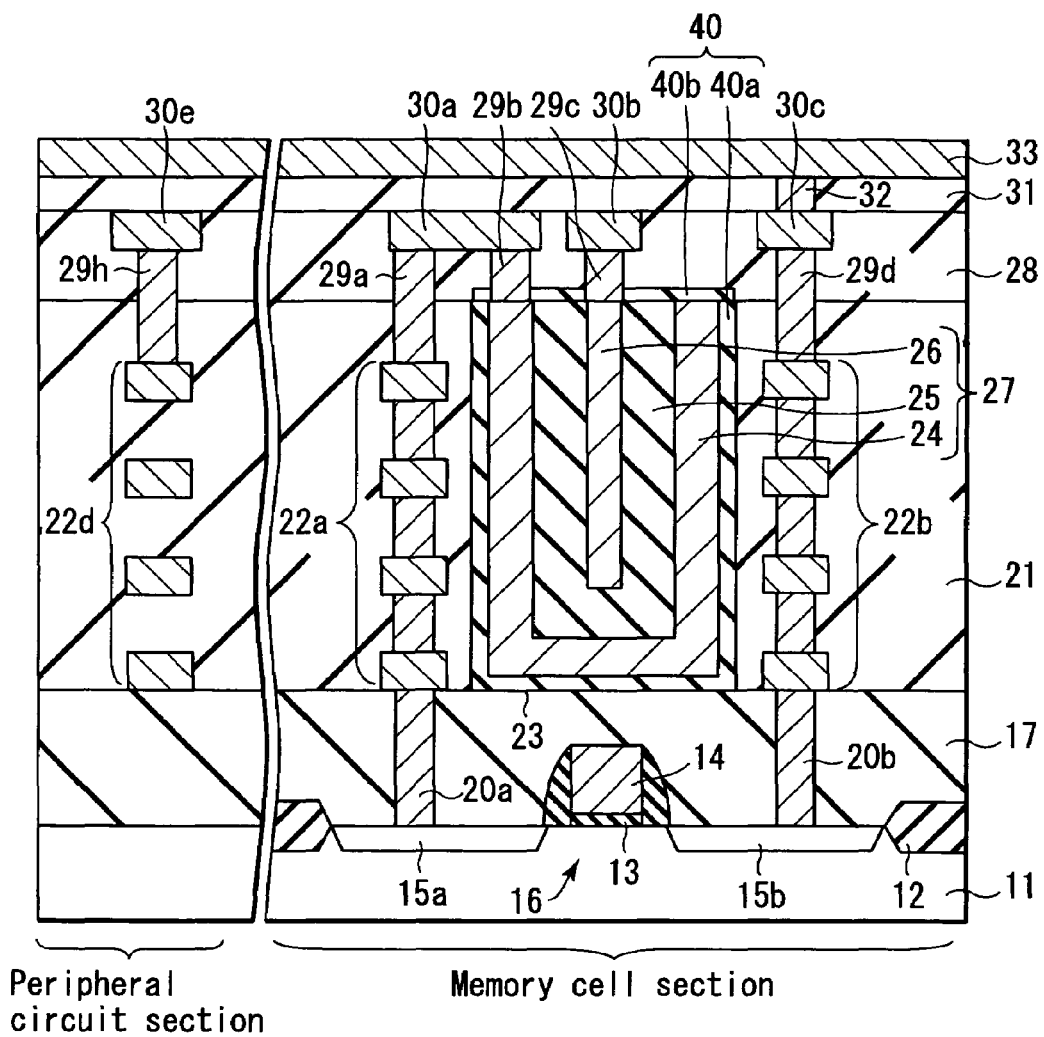
FIG. 11 is a cross-sectional view showing a semiconductor memory device of a basic example according to a second embodiment of the present invention.

FIG. 11 is a cross-sectional view showing a semiconductor memory device of a basic example according to a second embodiment of the present invention. The structure of the semiconductor memory device of the basic example according to the second embodiment will be described below. Here, points different from the basic structure of the first embodiment will be mainly described.

The basic example of the second embodiment differs from that of the first embodiment in the following points. The bottom, side and upper surfaces of the three-dimensional ferroelectric capacitor 27 are formed with a hydrogen barrier film 40. The hydrogen barrier film 40 surrounds the three-dimensional ferroelectric capacitor 27 so that the capacitor 27 can be partitioned from multi-layer interconnect layers 22a, 22b and transistor 16.

The hydrogen barrier film 40 has a first part 40a formed at the side and bottom surfaces of the capacitor 27, and a second part 40b formed at the top surface thereof.

The hydrogen barrier film 40 may be a single or plural layer. For example, the hydrogen barrier film 40 consists of a film containing at least one of insulating materials such as $Al_2O_3$, $TiO_2$ and SiN. In this case, the first part 40a of the hydrogen barrier film 40 may be formed of conductive materials.

The hydrogen barrier film 40 may be formed directly contacting with the capacitor 27. An insulating film is provided between the capacitor 27 and the hydrogen barrier film 40, and thereby, the capacitor 27 may be surrounded with a stacked film comprising the hydrogen barrier film 40 and the insulating film.

It is the most preferable that the hydrogen barrier film 40 is formed to surround the three-dimensional ferroelectric capacitor 27. In this case, the hydrogen barrier film 40 may be formed to surround part of the three-dimensional ferroelectric capacitor 27. For example, the hydrogen barrier film 40 may be formed at only first part 40a or second part 40b, or may be formed at only bottom or side surface of the capacitor 27.

Figure 12:
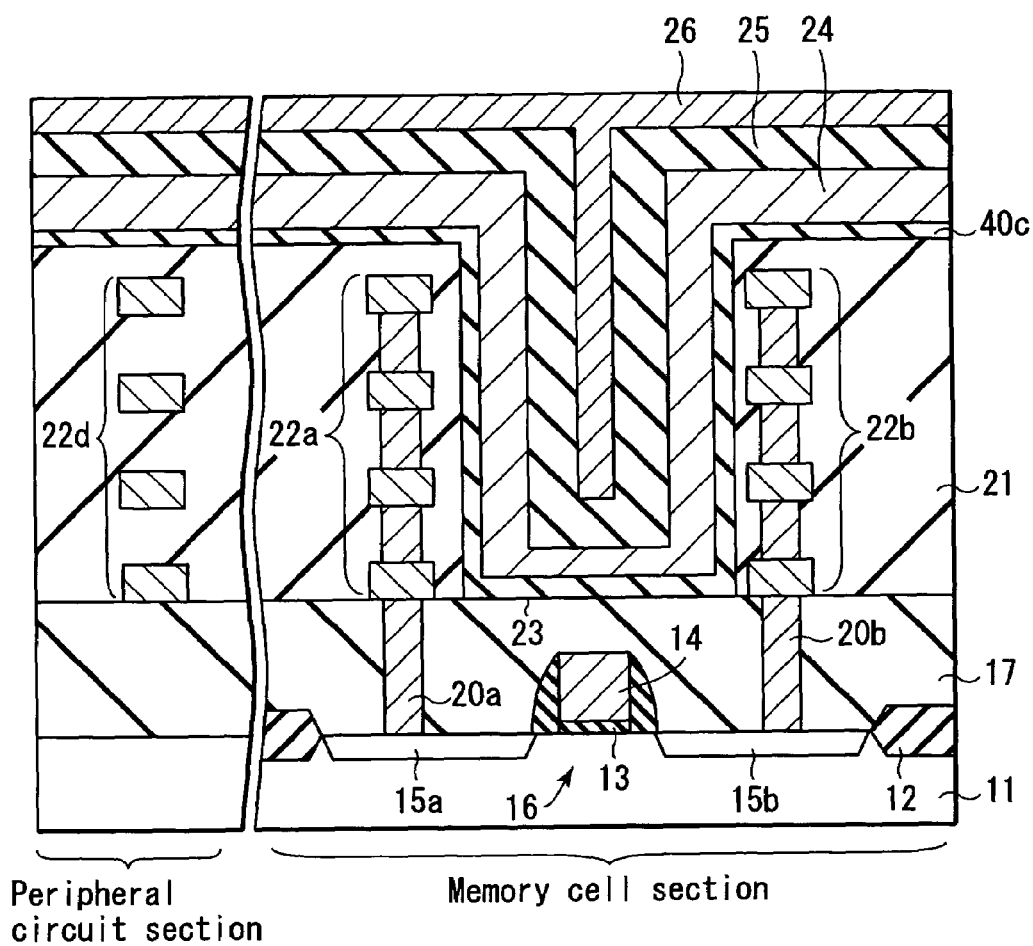
FIG. 12 to FIG. 14 are cross-sectional views showing the process of manufacturing the semiconductor memory device of the basic example according to the second embodiment.
Figure 13:
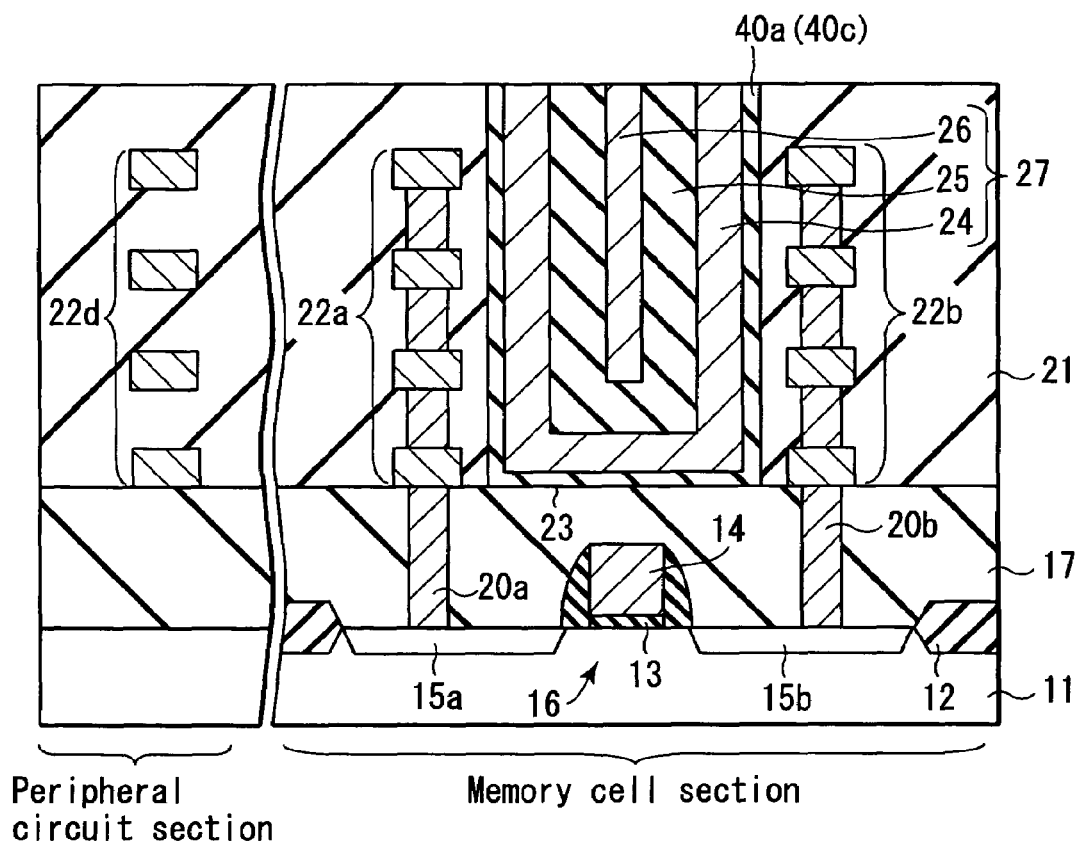
Figure 14:
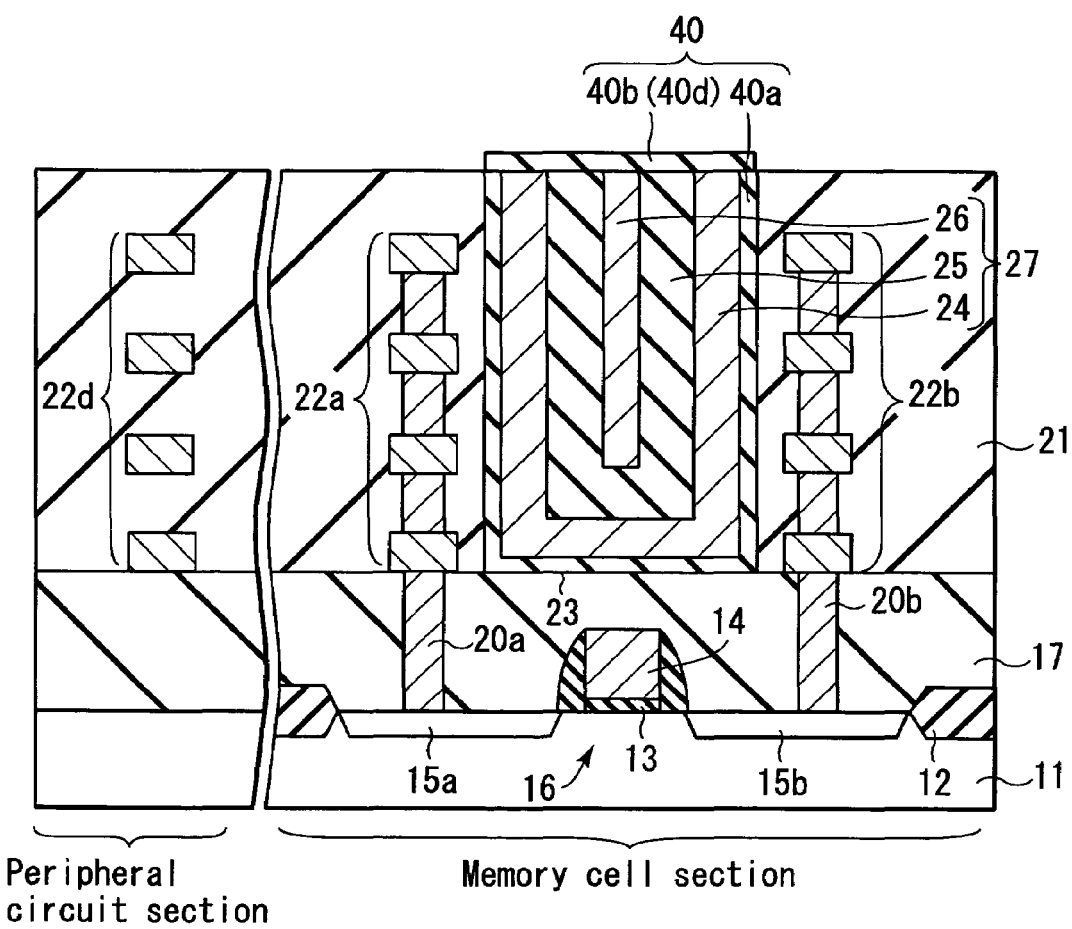

FIG. 12 to FIG. 14 are cross-sectional views showing the process of manufacturing the semiconductor memory device of the basic example according to the second embodiment of the present invention. The following is a description on the method of forming the hydrogen barrier film 40 of the second embodiment.

As shown in FIG. 12, the recessed portion 23 is formed in the interlayer insulating film 21, and thereafter, a hydrogen barrier material 40c is formed on the recessed portion 23 and the interlayer insulating film 21 by CVD or sputtering process. Bottom electrode 24, ferroelectric film 25 and top electrode 26 are successively deposited on the hydrogen barrier material 40c.

As illustrated in FIG. 13, the forgoing hydrogen barrier material 40c, bottom electrode 24, ferroelectric film 25 and top electrode 26 are patterned using CMP or RIE. By doing so, the first part 40a of the hydrogen barrier film 40 is formed while the ferroelectric capacitor 27 is formed.

As depicted in FIG. 14, a hydrogen barrier material 40d is formed on the capacitor 27 and the interlayer insulating film 21 by CVD or sputtering process. Thereafter, the hydrogen barrier material 40d is patterned, and thereby, the second part 40b of the hydrogen barrier film 40 is formed. In this manner, the capacitor 27 is surrounded with the hydrogen barrier film 40 comprising first and second parts 40a and 40b.

According to the basic example of the second embodiment, the same effect as the basic example of the first embodiment is obtained.

In addition, the capacitor 27 is surrounded with the hydrogen barrier film 40, so that the capacitor 27 can be protected from damage by hydrogen generated in the process after the capacitor 27 is formed.

[2-2] Modification Example 1

Figure 15:
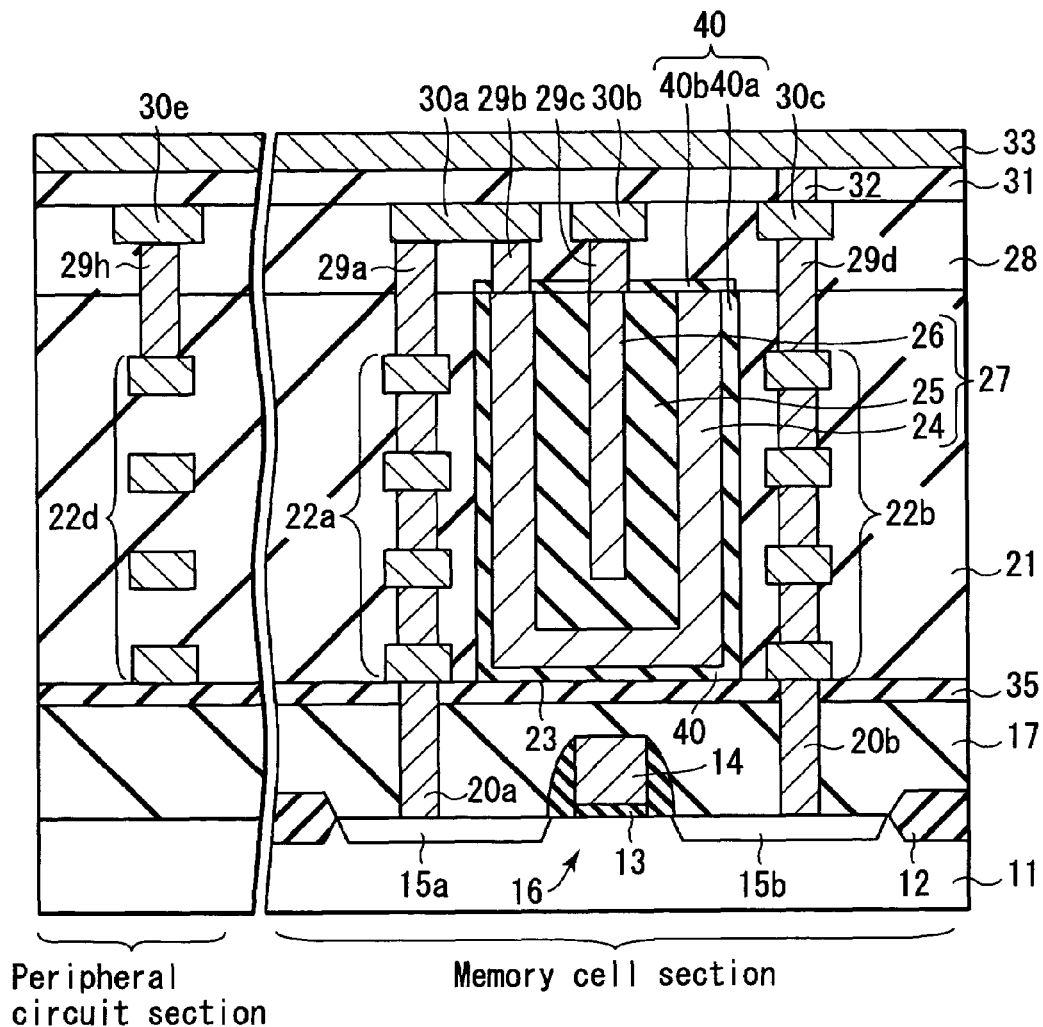
FIG. 15 is a cross-sectional view showing a semiconductor memory device of a modification example 1 according to the second embodiment of the present invention.

According to the modification example 1 of the second embodiment, a protection insulating film 35 is additionally formed under the recessed portion 23 of the basic example of the second embodiment, as seen from FIG. 15. The protection insulating film 35 has at least one of stopper, hydrogen barrier and oxygen barrier functions in forming the recessed portion 23.

According to the modification example 1 of the second embodiment, the following effects are obtained in addition to the same effect as the basic example of the second embodiment. The protection insulating film 35 serves to improve the controllability of the distance between the bottom surface of the recessed portion 23 and the upper surface of the gate electrode 14. In addition, the protection insulating film 35 serves to obtain hydrogen and oxygen barrier effects.

[2-3] Modification Example 2

Figure 16:
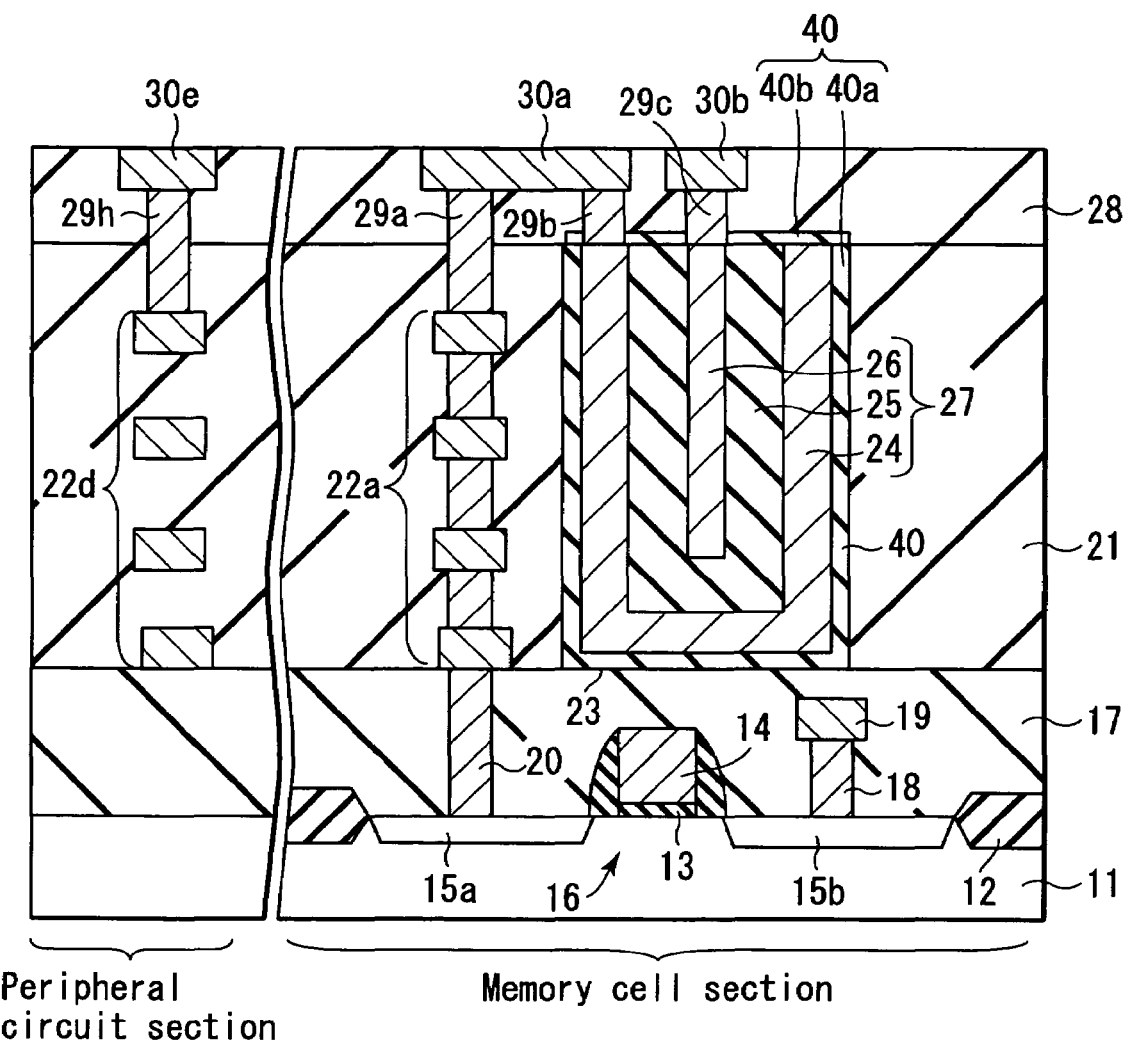
FIG. 16 is a cross-sectional view showing a semiconductor memory device of a modification example 2 according to the second embodiment of the present invention.

In the basic example of the second embodiment, the bit line 33 is arranged above the upper most surface of the capacitor 27. On the contrary, in the modification example 2 of the second embodiment, a bit line 19 is arranged below the bottom surface of the capacitor 27, as seen from FIG. 16.

According to the modification example 2 of the second embodiment, not only the same effect as the basic example of the second embodiment is obtained, but also there is no problem that misalignment of the capacitor 27 occurs.

[3] Third Embodiment

The third embodiment relates to a modification example of the first embodiment; more specifically, an oxygen barrier film for preventing interconnects from oxidizing is provided.

[3-1] Basic Example

Figure 17:
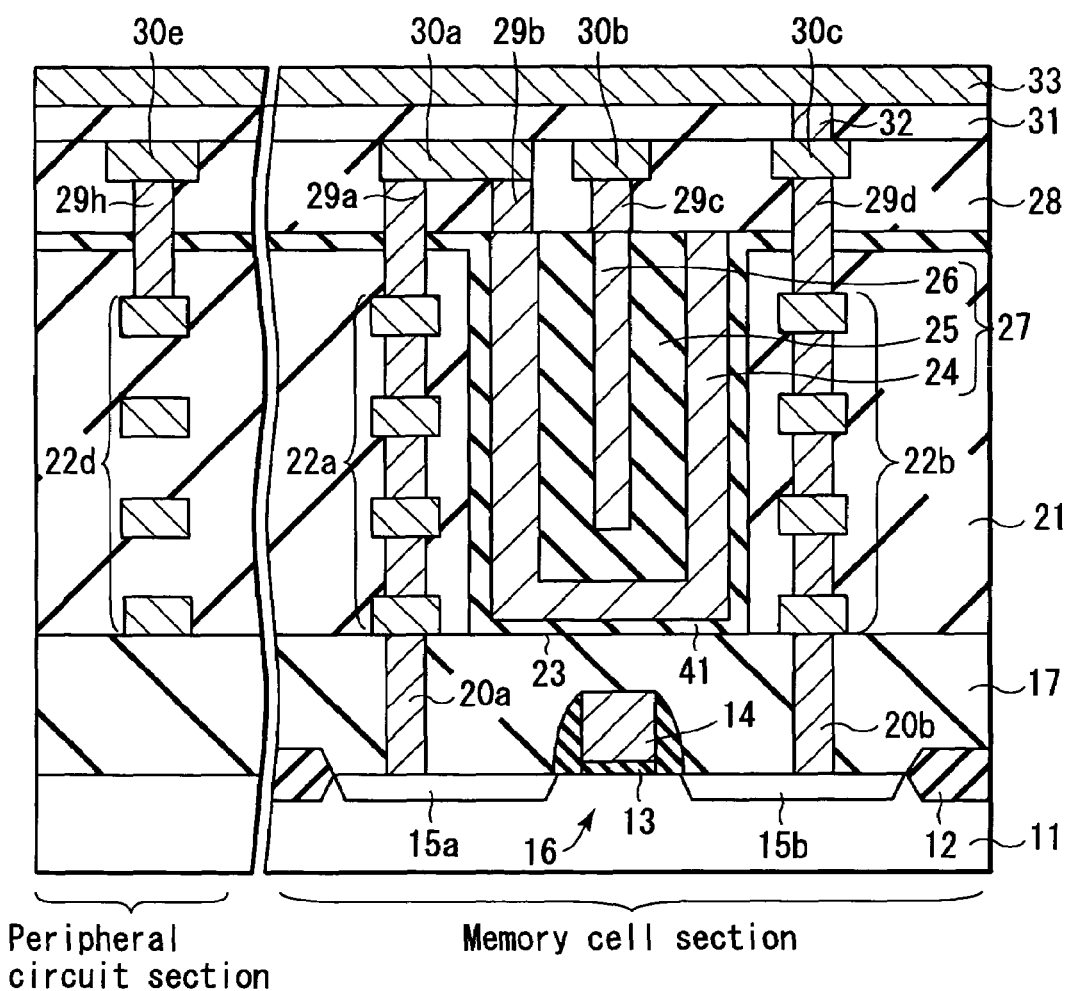
FIG. 17 is a cross-sectional view showing a semiconductor memory device of a basic example according to a third embodiment of the present invention.

FIG. 17 is a cross-sectional view showing a semiconductor memory device of a basic example according to a third embodiment of the present invention. The structure of the semiconductor memory device of the basic example according to the third embodiment will be described below. Here, points different from the basic structure of the first embodiment will mainly described.

The basic example of the third embodiment differs from that of the first embodiment in the following points. As seen from FIG. 17, an oxygen barrier film 41 is formed on the bottom and side surfaces of the three-dimensional ferroelectric capacitor 27 to coat multi-layer interconnect layers 22a, 22b and transistor 16.

The oxygen barrier film 41 may be a single or plural layer. For example, the oxygen barrier film 41 is formed of a film containing at least one of insulating materials such as $Al_2O_3$, SiN and SiON.

The oxygen barrier film 41 is formed on the recessed portion 23 and the interlayer insulating film 21 after the recessed portion 23 is formed in the interlayer insulating film 21. The ferroelectric capacitor 27 is patterned so that the oxygen barrier film 41 is left on the interlayer insulating film 21 after being formed.

According to the basic example of the third embodiment, the same effect as the basic example of the first embodiment is obtained.

In addition, the oxygen barrier film 41 covers multi-layer interconnect layers 22a, 22b and transistor 16. By doing so, it is possible to prevent reaction from occurring by intrusion of oxygen into interconnects such as multi-layer interconnect layers 22a and 22b in the process of forming the capacitor 27.

[3-2] Modification Example 1

Figure 18:
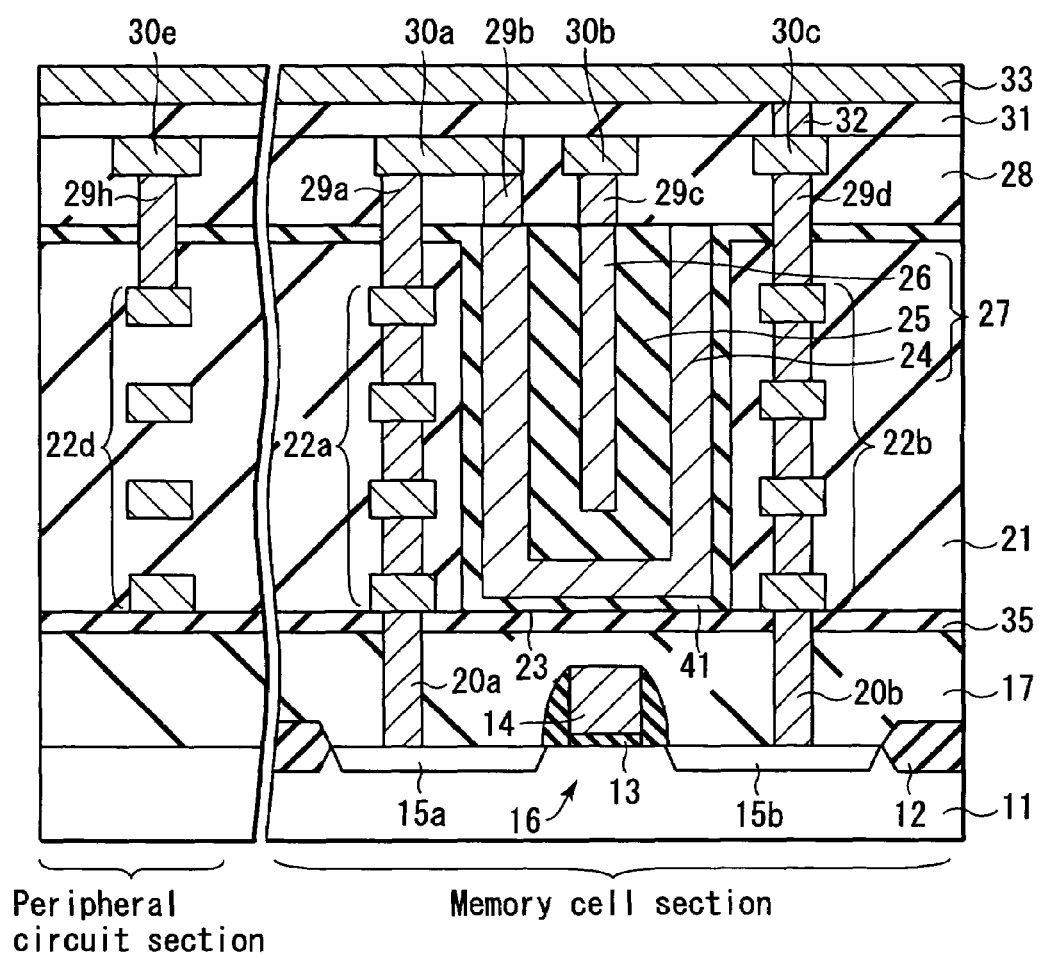
FIG. 18 is a cross-sectional view showing a semiconductor memory device of a modification example 1 according to the third embodiment of the present invention.

According to the modification example 1 of the third embodiment, a protection insulating film 35 is additionally formed under the recessed portion 23 of the basic example of the second embodiment, as seen from FIG. 18. The protection insulating film 35 has at least one of stopper, hydrogen barrier and oxygen barrier functions in forming the recessed portion 23.

According to the modification example 1 of the third embodiment, the following effects are obtained in addition to the same effect as the basic example of the third embodiment. The protection insulating film 35 serves to improve the controllability of the distance between the bottom surface of the recessed portion 23 and the upper surface of the gate electrode 14. In addition, the protection insulating film 35 serves to obtain hydrogen and oxygen barrier effects.

[3-3] Modification Example 2

Figure 19:
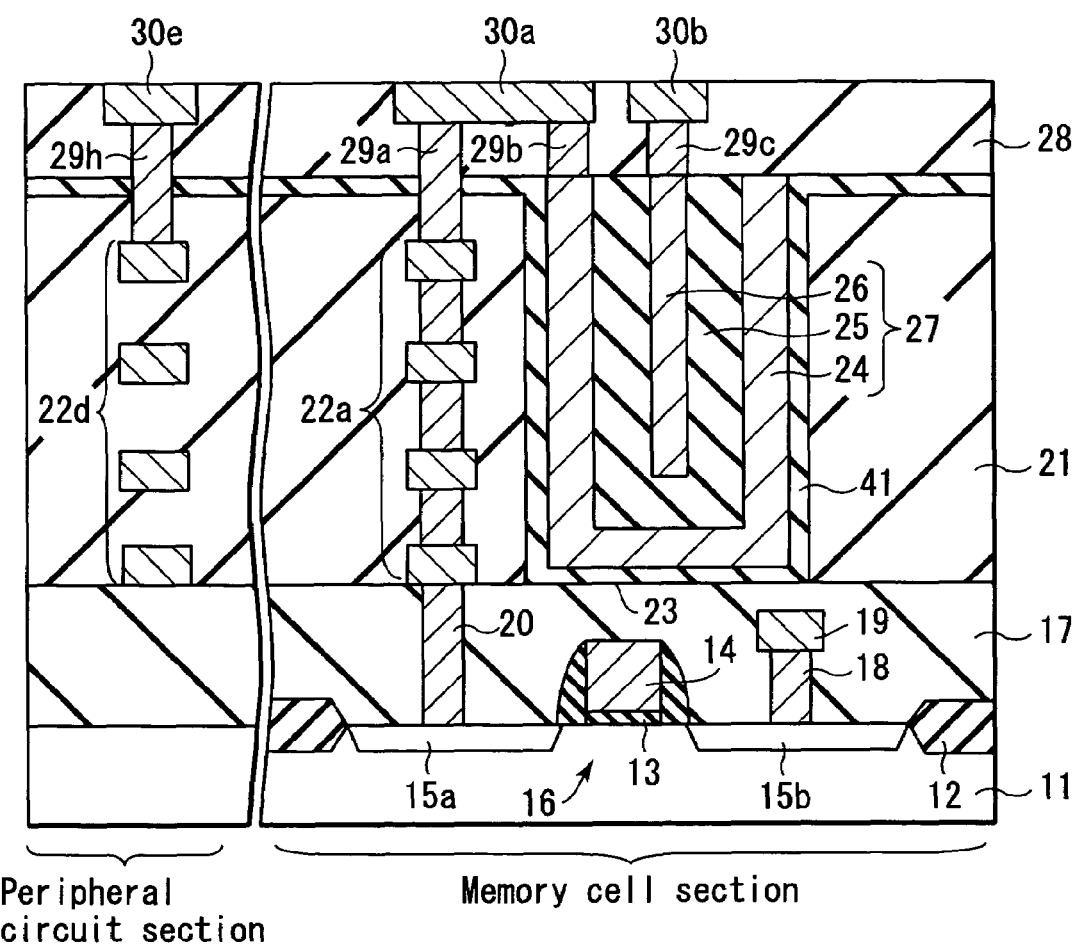
FIG. 19 is a cross-sectional view showing a semiconductor memory device of a modification example 2 according to the third embodiment of the present invention.

In the basic example of the third embodiment, the bit line 33 is arranged above the upper most surface of the capacitor 27. On the contrary, in the modification example 2 of the third embodiment, a bit line 19 is arranged below the bottom surface of the capacitor 27, as seen from FIG. 19.

According to the modification example 2 of the third embodiment, not only the same effect as the basic example of the third embodiment is obtained, but also there is no problem that misalignment of the capacitor 27 occurs.

[4] Fourth Embodiment

The fourth embodiment relates to an example combining the second and third embodiments; more specifically, hydrogen and oxygen barrier films are provided.

[4-1] Basic Example

Figure 20:
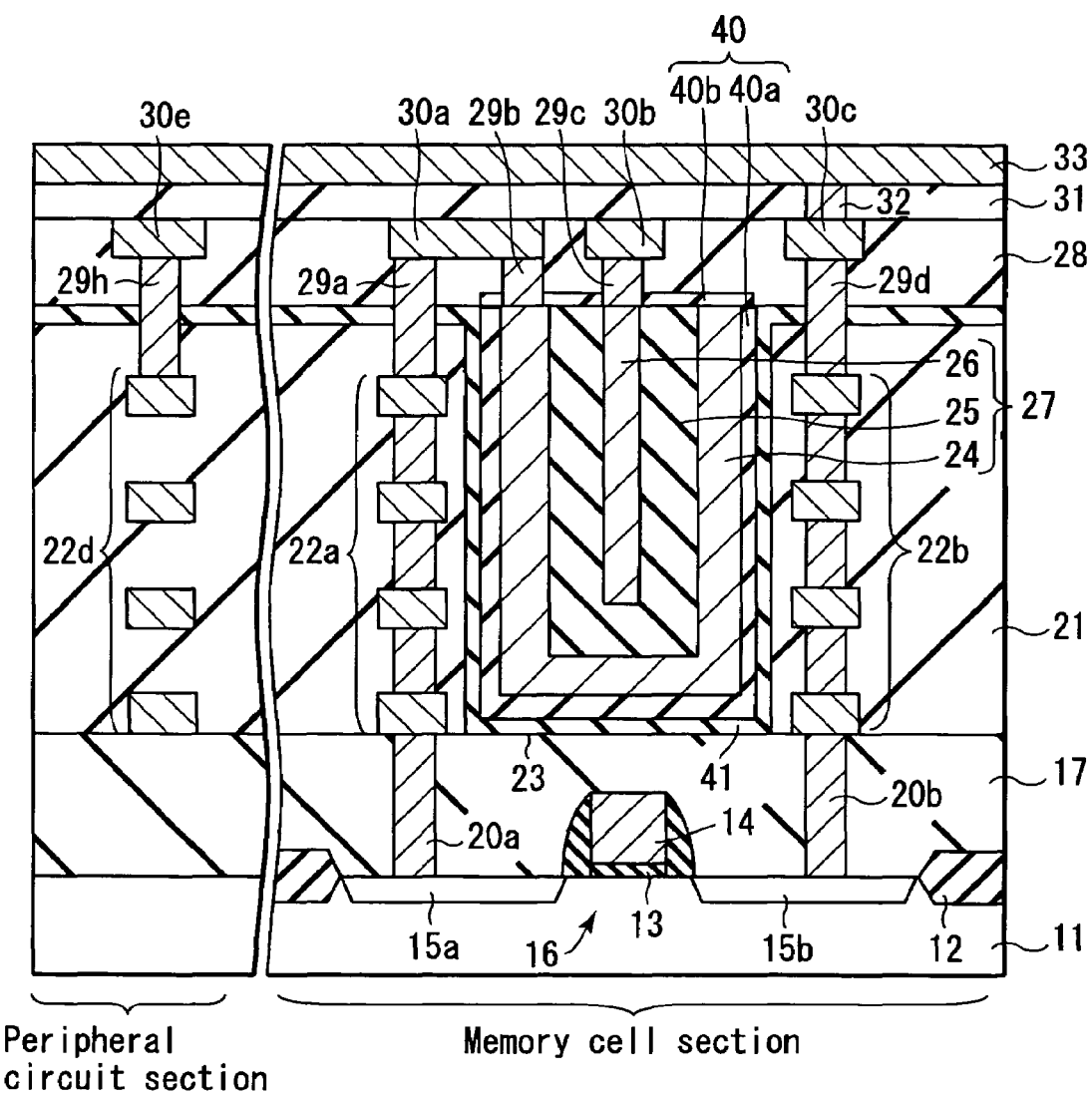
FIG. 20 is a cross-sectional view showing a semiconductor memory device of a basic example according to a fourth embodiment of the present invention.

FIG. 20 is a cross-sectional view showing a semiconductor memory device of a basic example according to a fourth embodiment of the present invention. The structure of the semiconductor memory device of the basic example according to the fourth embodiment will be described below. Here, points different from the basic structure of the first embodiment will be mainly described.

The basic example of the fourth embodiment differs from that of the first embodiment in the following point. As shown in FIG. 20, the bottom, side and upper surfaces of the three-dimensional ferroelectric capacitor 27 are formed with a hydrogen barrier film 40. In addition, an oxygen barrier film 41 is formed on the bottom and side surfaces of the hydrogen barrier film 40 and the interlayer insulating film 21. Thus, in the basic example of the fourth embodiment, the hydrogen barrier film 40 surrounds the capacitor 27, and multi-layer interconnect layers 22a, 22b and transistor 16 are coated with the oxygen barrier film 41.

The hydrogen barrier film 40 and the oxygen barrier film 41 may be a single or plural layer. For example, the hydrogen barrier film 40 consists of a film containing at least one of insulating materials such as $Al_2O_3$, $TiO_2$ and SiN. The oxygen barrier film 41 consists of a film containing at least one of insulating materials such as $Al_2O_3$, SiN and SiON. The first part 40a of the hydrogen barrier film 40 may be formed of a conductive material.

The hydrogen barrier film 40 may be formed directly contacting with the capacitor 27. An insulating film is provided between the capacitor 27 and the hydrogen barrier film 40, and thereby, the capacitor 27 may be surrounded with a stacked film comprising the hydrogen barrier film 40 and the insulating film. The oxygen barrier film 41 may be formed directly contacting with the hydrogen barrier film 40. An insulating film is provided between the oxygen barrier film 41 and the hydrogen barrier film 40.

Preferably, the hydrogen barrier film 40 is formed after the oxygen barrier film 41 is formed, and is arranged inside the oxygen barrier film 41, that is, on the side of the capacitor 27.

According to the basic example of the fourth embodiment, the same effect as the second and third embodiments is obtained. In addition, it is possible to simultaneously prevent oxidization of interconnects such as multi-layer interconnect layers 22a and 22b and degradation of capacitor 27 by hydrogen. Thus, it is possible to form the capacitor 27, which is durable to process degradation.

[4-2] Modification Example 1

Figure 21:
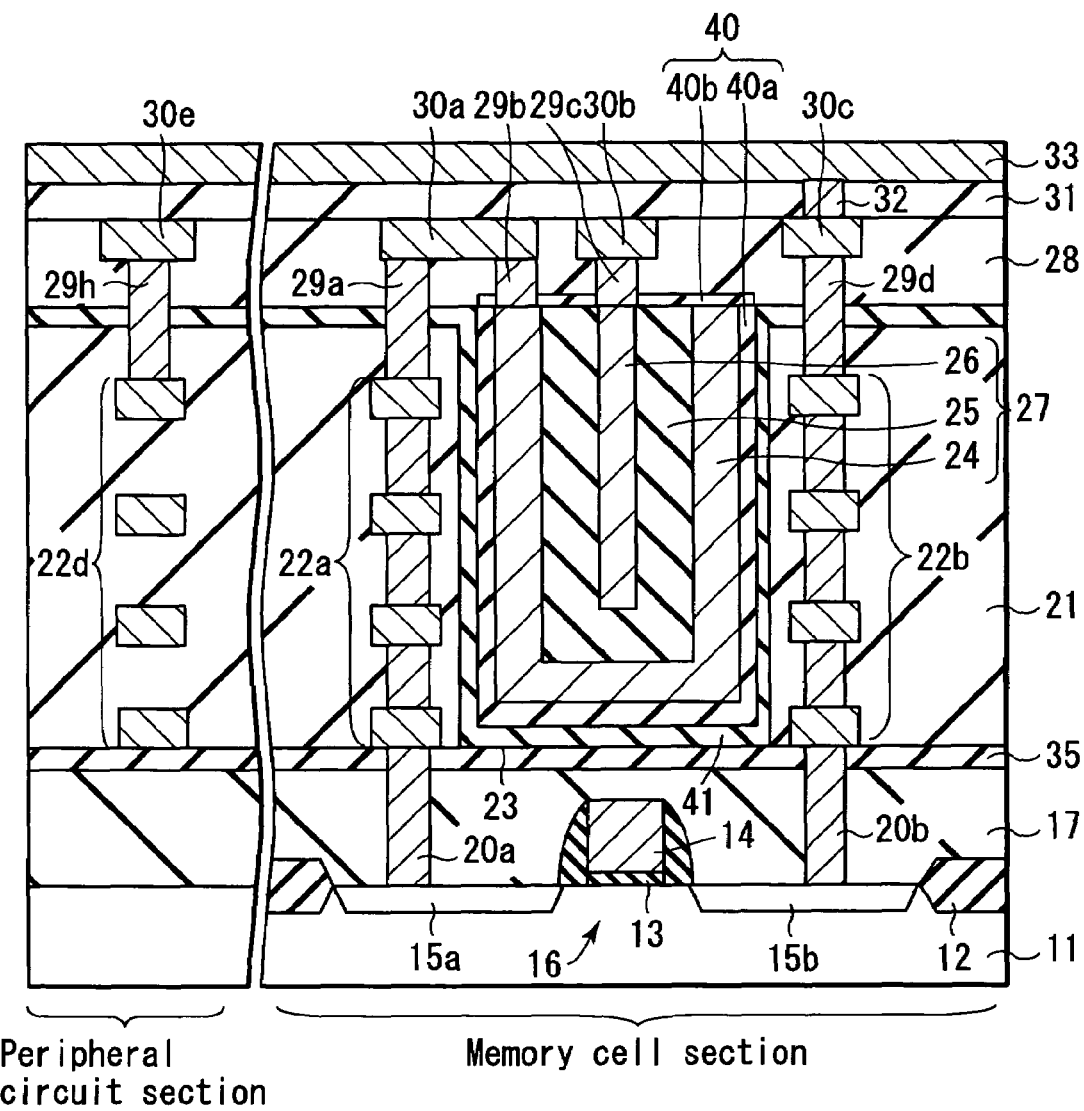
FIG. 21 is a cross-sectional view showing a semiconductor memory device of a modification example 1 according to the fourth embodiment of the present invention.

According to the modification example 1 of the fourth embodiment, a protection insulating film 35 is additionally formed under the recessed portion 23 of the basic example of the fourth embodiment, as seen from FIG. 21. The protection insulating film 35 has at least one of stopper, hydrogen barrier and oxygen barrier functions in forming the recessed portion 23.

According to the modification example 1 of the fourth embodiment, the following effects are obtained in addition to the same effect as the basic example of the fourth embodiment. The protection insulating film 35 serves to improve the controllability of the distance between the bottom surface of the recessed portion 23 and the upper surface of the gate electrode 14. In addition, the protection insulating film 35 serves to obtain hydrogen and oxygen barrier effects.

[4-3] Modification Example 2

Figure 22:
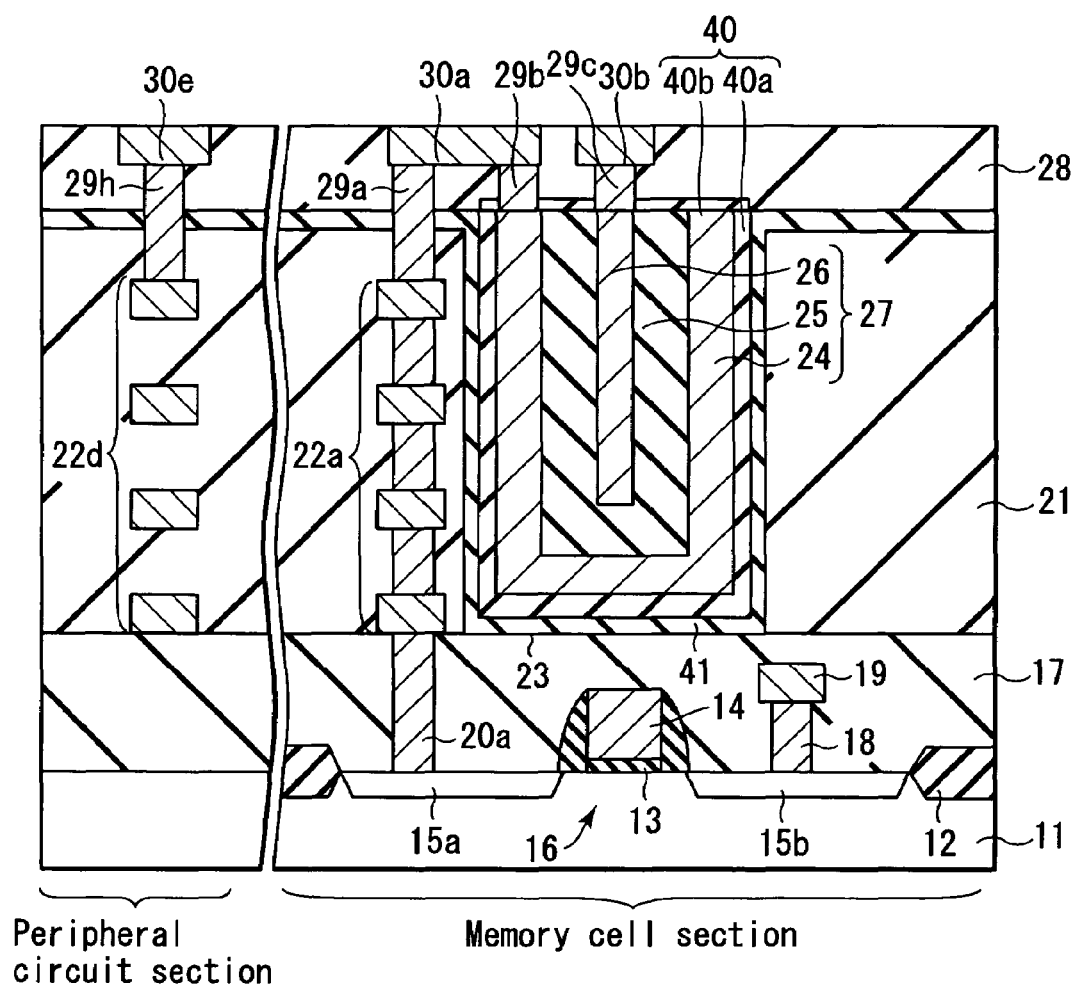
FIG. 22 is a cross-sectional view showing a semiconductor memory device of a modification example 2 according to the fourth embodiment of the present invention.

In the basic example of the fourth embodiment, the bit line 33 is arranged above the upper most surface of the capacitor 27. On the contrary, in the modification example 2 of the fourth embodiment, a bit line 19 is arranged below the bottom surface of the capacitor 27, as seen from FIG. 22.

According to the modification example 2 of the fourth embodiment, not only the same effect as the basic example of the fourth embodiment is obtained, but also there is no problem that misalignment of the capacitor 27 occurs.

[5] Fifth Embodiment

The fifth embodiment has the structure in which the three-dimensional ferroelectric capacitor 27 and the multi-layer interconnect layer are connected in the following manner. Namely, the bottom electrode of the capacitor 27 and the uppermost layer interconnect of the layer are connected by a projected portion of the bottom electrode via an reaction preventing conductive film without using contacts.

[5-1] Basic Example

Figure 23:
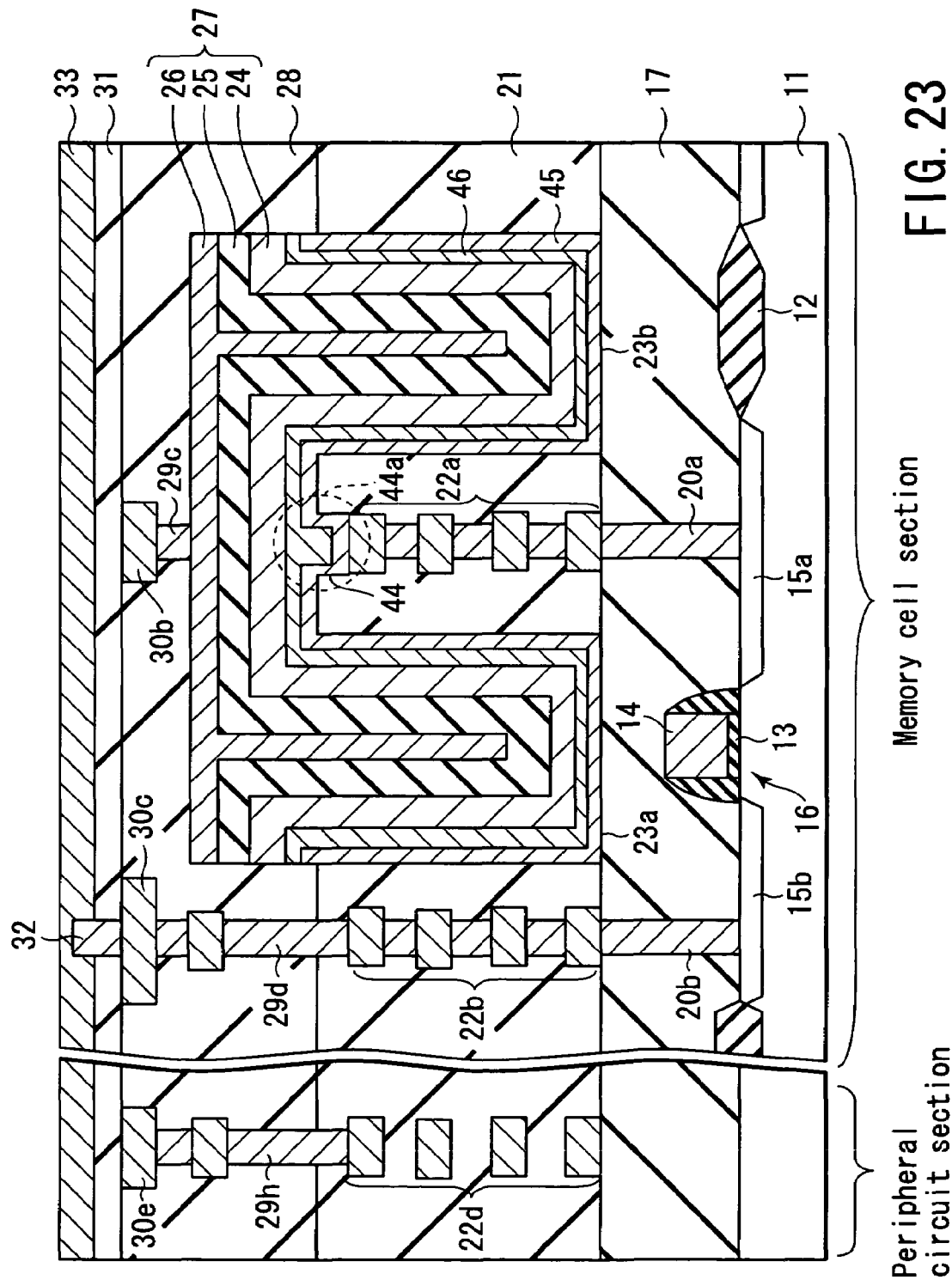
FIG. 23 is a cross-sectional view showing a semiconductor memory device of a basic example according to a fifth embodiment of the present invention.

FIG. 23 is a cross-sectional view showing a semiconductor memory device of a basic example according to a fifth embodiment of the present invention. The structure of the semiconductor memory device of the basic example according to the fifth embodiment will be described below. Here, points different from the basic structure of the first embodiment will be mainly described.

Different points in the basic example between the fifth embodiment and the first embodiment are as follows. First, the bottom electrode 24 of the three-dimensional ferroelectric capacitor 27 and the uppermost layer interconnect of the multi-layer interconnect layer 22a are connected via a projected portion 44a, as seen from FIG. 23. In this case, the projected portion 44 is formed in the following manner. A recessed portion 44 penetrating from the upper surface of the interlayer insulating film 21 to the uppermost layer interconnect of the multi-layer interconnect layer 22a is filled with a conductive material. In the basic example, reaction preventing conductive films 45 and 46 are provided between bottom and side surfaces of recessed portions 23a and 23b and the bottom electrode 24. Thus, these reaction preventing conductive films 45 and 46 filled in the recessed portion 44 function as the contact.

Secondary, in order to achieve a large capacity of the capacitor 27, two recessed portions 23a and 23b are formed in the interlayer insulating film 21, and one capacitor 27 is continuously formed in two recessed portions 23a and 23b via the recessed portion 44.

The reaction preventing conductive films 45 and 46 are not necessarily two layers, and may be a single or plural layer. The reaction preventing conductive films 45 and 46 consist of a film containing at least one of TiN, $IrO_2$ and TiAlN. The reaction preventing conductive films 45 and 46 are provided to prevent the reaction of the material of the bottom electrode 24 with the semiconductor substrate 11.

Figure 24:
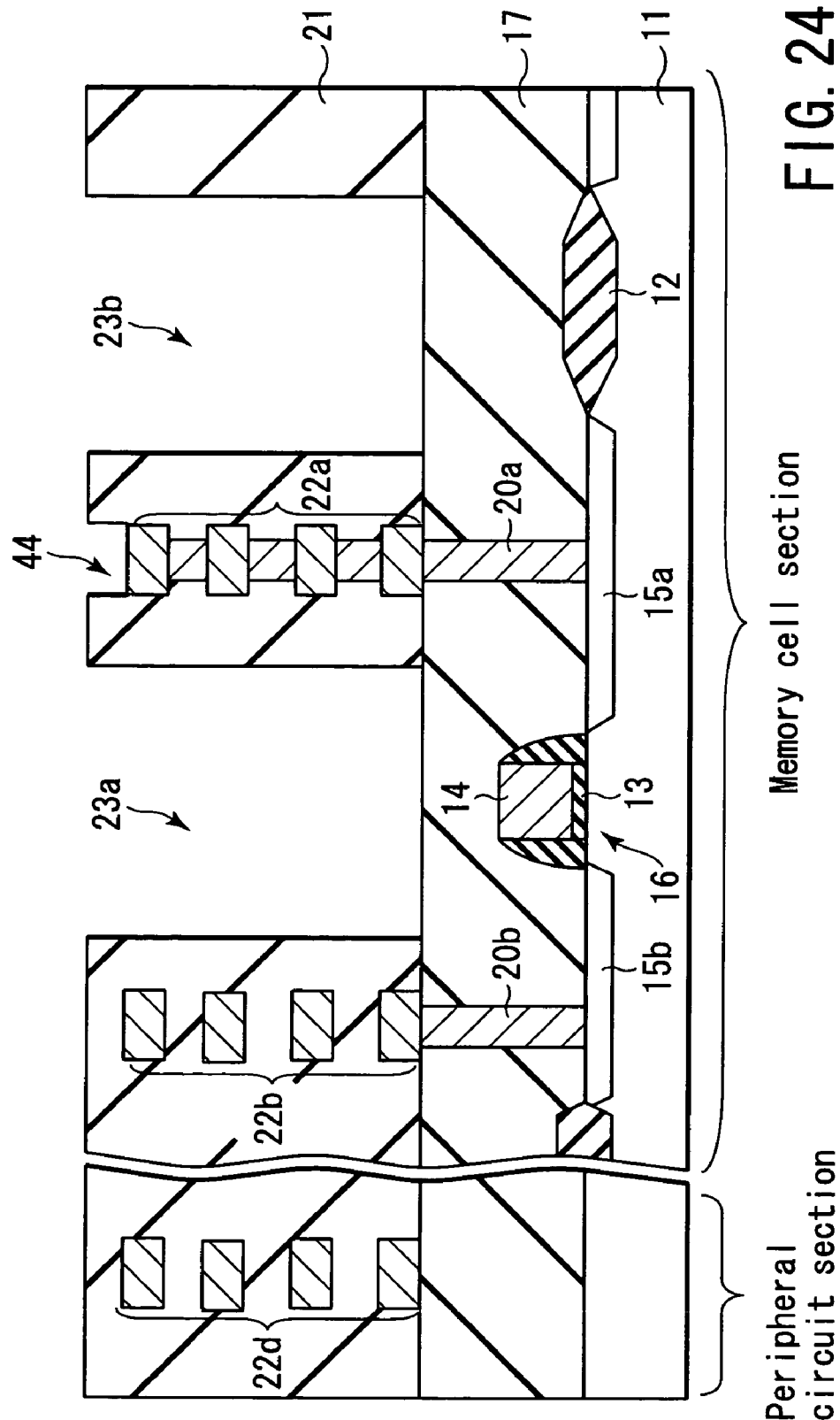
FIG. 24 and FIG. 25 are cross-sectional views showing the process of manufacturing the semiconductor memory device of the basic example according to the fifth embodiment.
Figure 25:
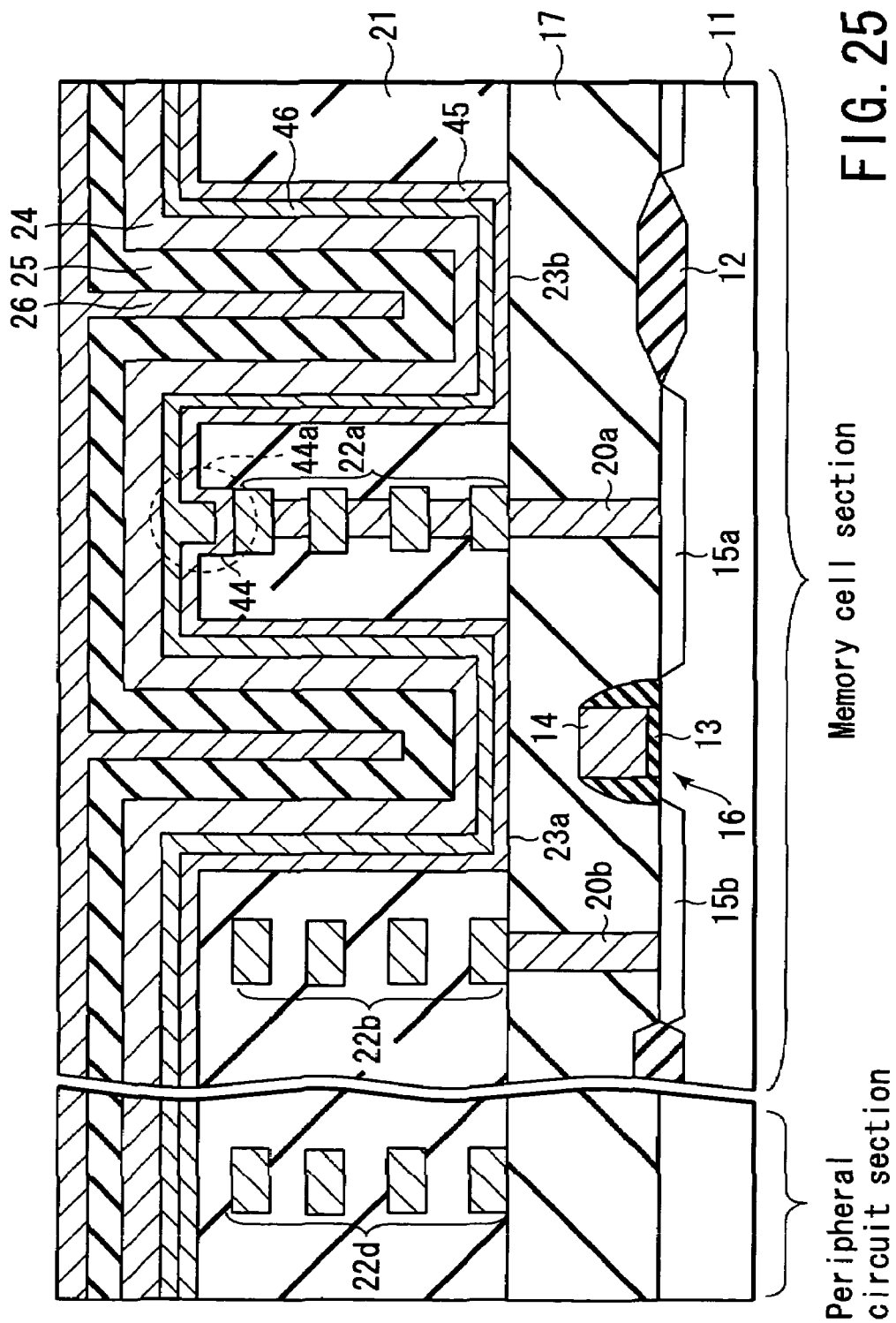

FIG. 24 and FIG. 25 are cross-sectional views showing the process of manufacturing the semiconductor memory device of the basic example according to the fifth embodiment. The following is a description on the method of forming the projected portion according to the fifth embodiment.

As shown in FIG. 24, recessed portions 23a and 23b are formed in the interlayer insulating film 21. In the formation of the recessed portion 44, the interlayer insulating film 21 is removed until the surface of the uppermost layer interconnect of the multi-layer interconnect layer 22a is exposed.

As illustrated in FIG. 25, reaction preventing conductive films 45, 46, bottom electrode 24, ferroelectric film 25 and top electrode 26 are successively deposited and patterned on recessed portions 23a, 23b, 44 and interlayer insulating film 21.

According to the basic example of the fifth embodiment, the same effect as the first embodiment is obtained.

In addition, the bottom electrode 24 of the capacitor 27 and the multi-layer interconnect layer 22a are connected via the projected portion 44a (concavo-concave surface) having an aspect ratio lower than the contact 29 described in the first embodiment.

[5-2] Modification Example 1

Figure 26:
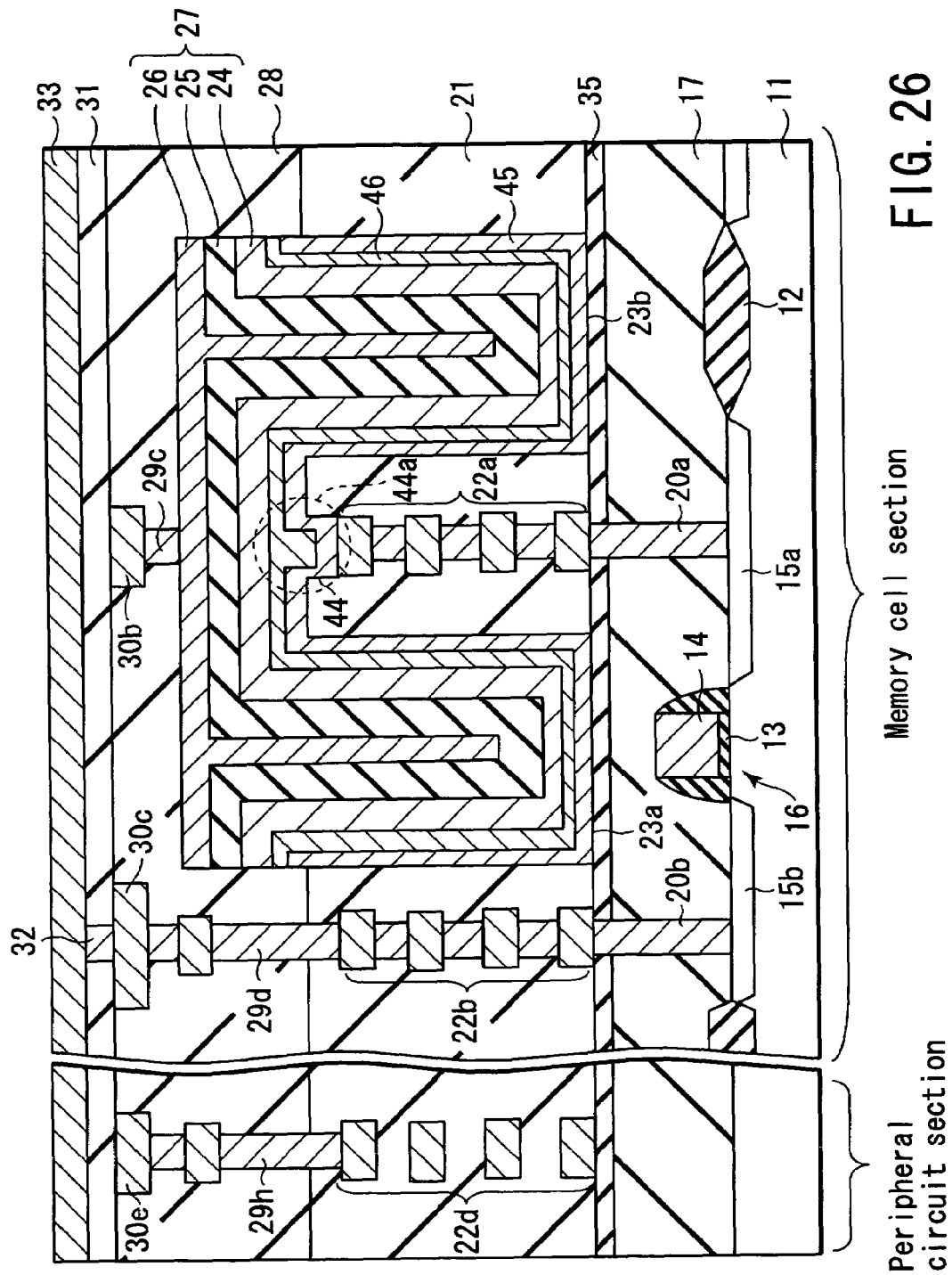
FIG. 26 is a cross-sectional view showing a semiconductor memory device of a modification example 1 according to the fifth embodiment of the present invention.

According to the modification example 1 of the fifth embodiment, a protection insulating film 35 is additionally formed under the recessed portions 23a and 23b of the basic example of the fifth embodiment, as seen from FIG. 26. The protection insulating film 35 has at least one of stopper, hydrogen barrier and oxygen barrier functions in forming the recessed portions 23a and 23b.

According to the modification example 1 of the fifth embodiment, the following effects are obtained in addition to the same effect as the basic example of the fifth embodiment. The protection insulating film 35 serves to improve the controllability of the distance between the bottom surfaces of the recessed portions 23a, 23b and the upper surface of the gate electrode 14. In addition, the protection insulating film 35 serves to obtain hydrogen and oxygen barrier effects.

[5-3] Modification Example 2

Figure 27:
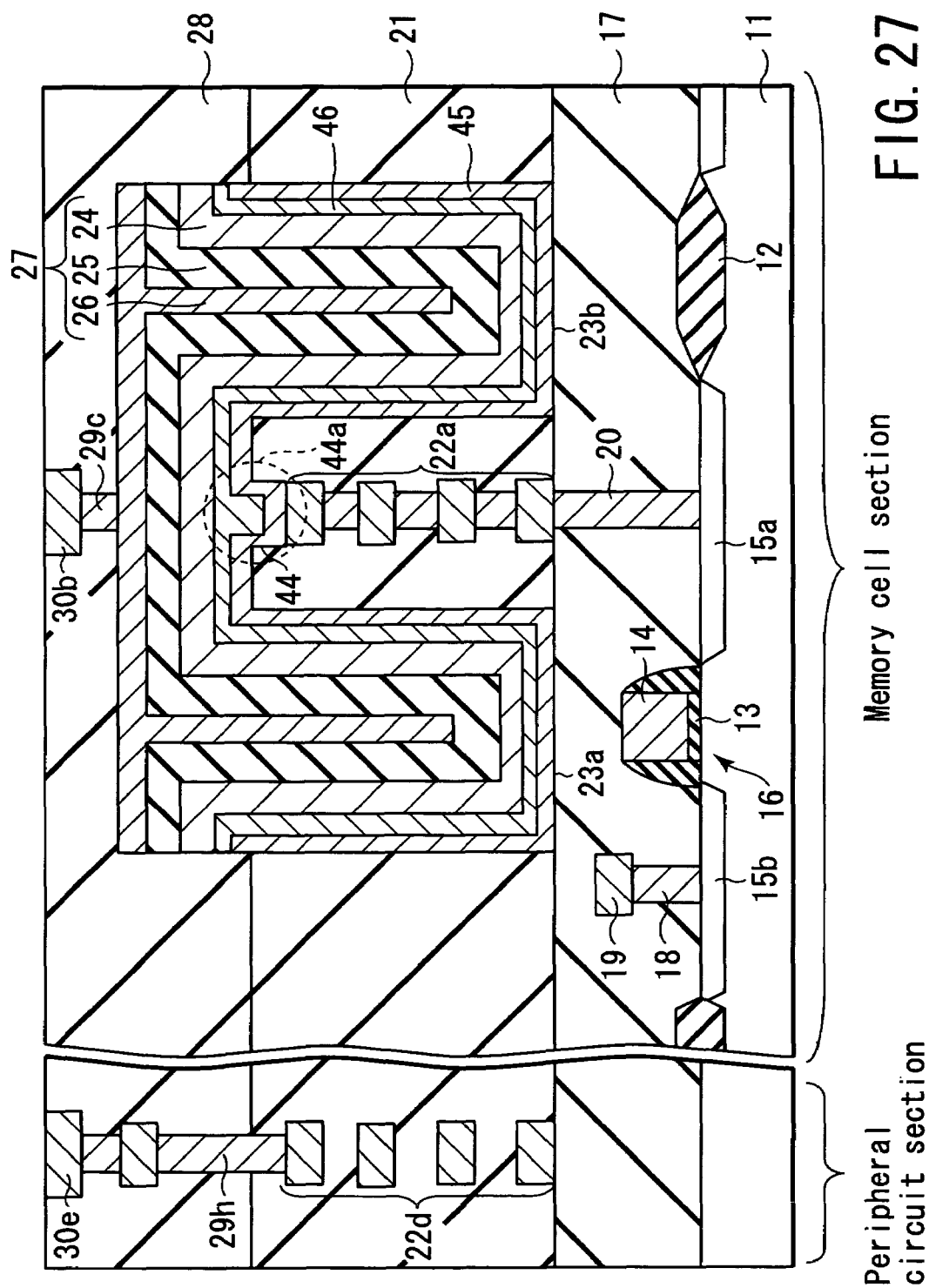
FIG. 27 is a cross-sectional view showing a semiconductor memory device of a modification example 2 according to the fifth embodiment of the present invention.

In the basic example of the fifth embodiment, the bit line 33 is arranged above the upper most surface of the capacitor 27. On the contrary, in the modification example 2 of the fifth embodiment, a bit line 19 is arranged below the bottom surface of the capacitor 27, as seen from FIG. 27.

According to the modification example 2 of the fifth embodiment, not only the same effect as the basic example of the fifth embodiment is obtained, but also there is no problem that misalignment of the capacitor 27 occurs.

[6] Sixth Embodiment

The sixth embodiment relates to a modification example of the fifth embodiment. The three-dimensional ferroelectric capacitor and the multi-layer interconnect layer are connected in the following manner. Namely, the bottom electrode of the capacitor and the uppermost layer interconnect of the layer are connected by a flat surface of the bottom electrode via an reaction preventing conductive film without using the contact and the projected portion.

[6-1] Basic Example

Figure 28:
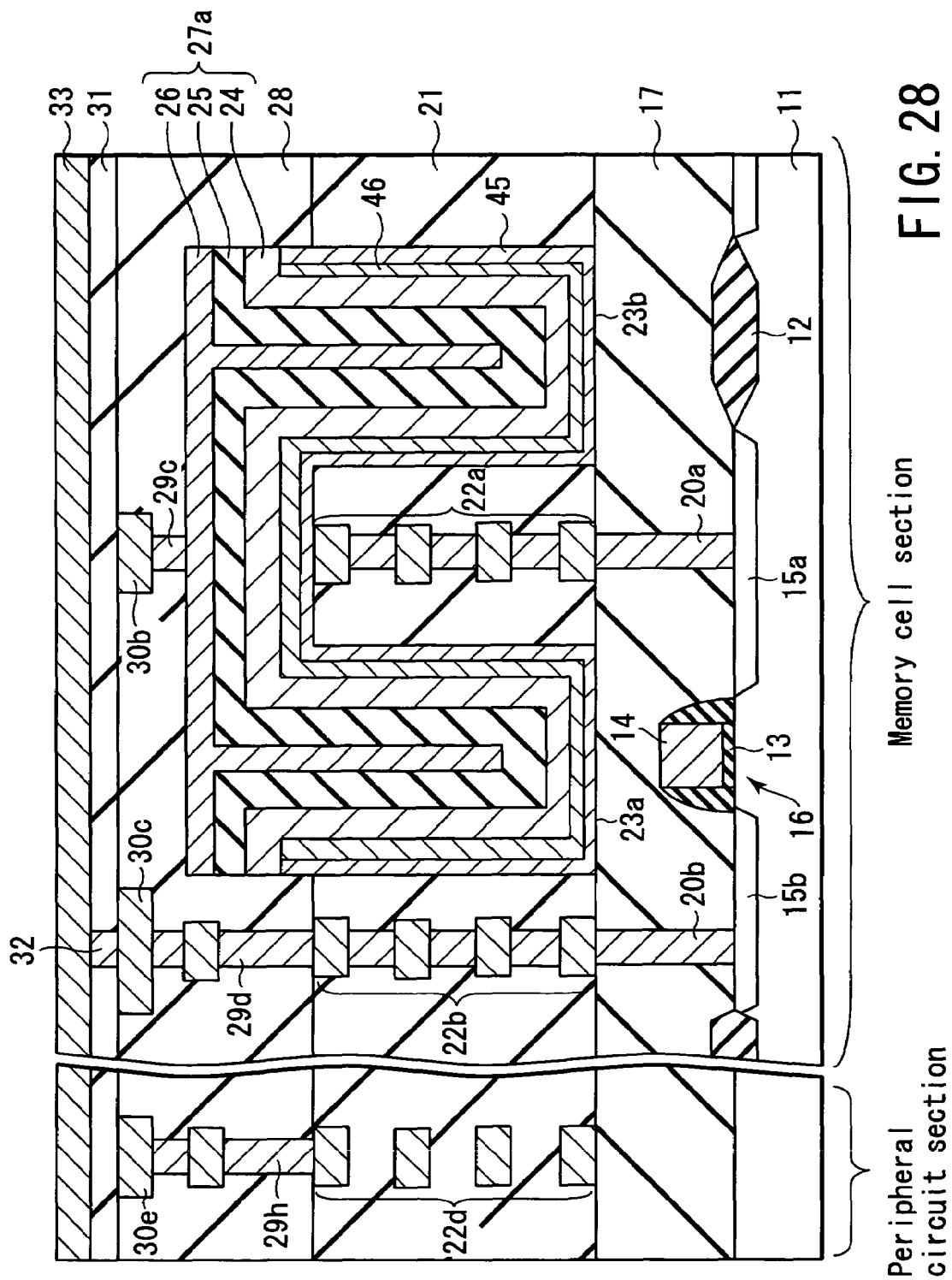
FIG. 28 is a cross-sectional view showing a semiconductor memory device of a basic example according to a sixth embodiment of the present invention.

FIG. 28 is a cross-sectional view showing a semiconductor memory device of a basic example according to a sixth embodiment of the present invention. The structure of the semiconductor memory device of the basic example according to the sixth embodiment will be described below. Here, points different from the basic structure of the fifth embodiment will be mainly described.

The basic example of the sixth embodiment differs from that of the fifth embodiment in the following point. As seen from FIG. 28, the bottom electrode 24 of the three-dimensional ferroelectric capacitor 27 and the uppermost layer interconnect of the multi-layer interconnect layer 22a are connected without using the projected portion 44a. In other words, no projected portion 44a of the fifth embodiment is formed in the basic example of the sixth embodiment. In place of the projected portion 44a, the multi-layer interconnect layer 22a is formed so that the upper surface of the uppermost layer interconnect thereof can be exposed from the interlayer insulating film 21. The reaction preventing conductive film 45 is formed to contact directly with the uppermost layer interconnect. By doing so, the bottom electrode 24 of the capacitor 27 and the multi-layer interconnect layer 22a are connected without using the contact and the projected portion 44a.

According to the basic example of the sixth embodiment, the same effect as the fifth embodiment is obtained.

In addition, the upper surface of the uppermost layer interconnect of the multi-layer interconnect layer 22a is exposed from the interlayer insulating film 21. By doing so, the bottom electrode 24 of the capacitor 27 and the multi-layer interconnect layer 22a are connected without using contact and projected portion 44a. Thus, the process of forming the contact and the projected portion 44a is omitted, so that the process can be simplified.

[6-2] Modification Example 1

Figure 29:
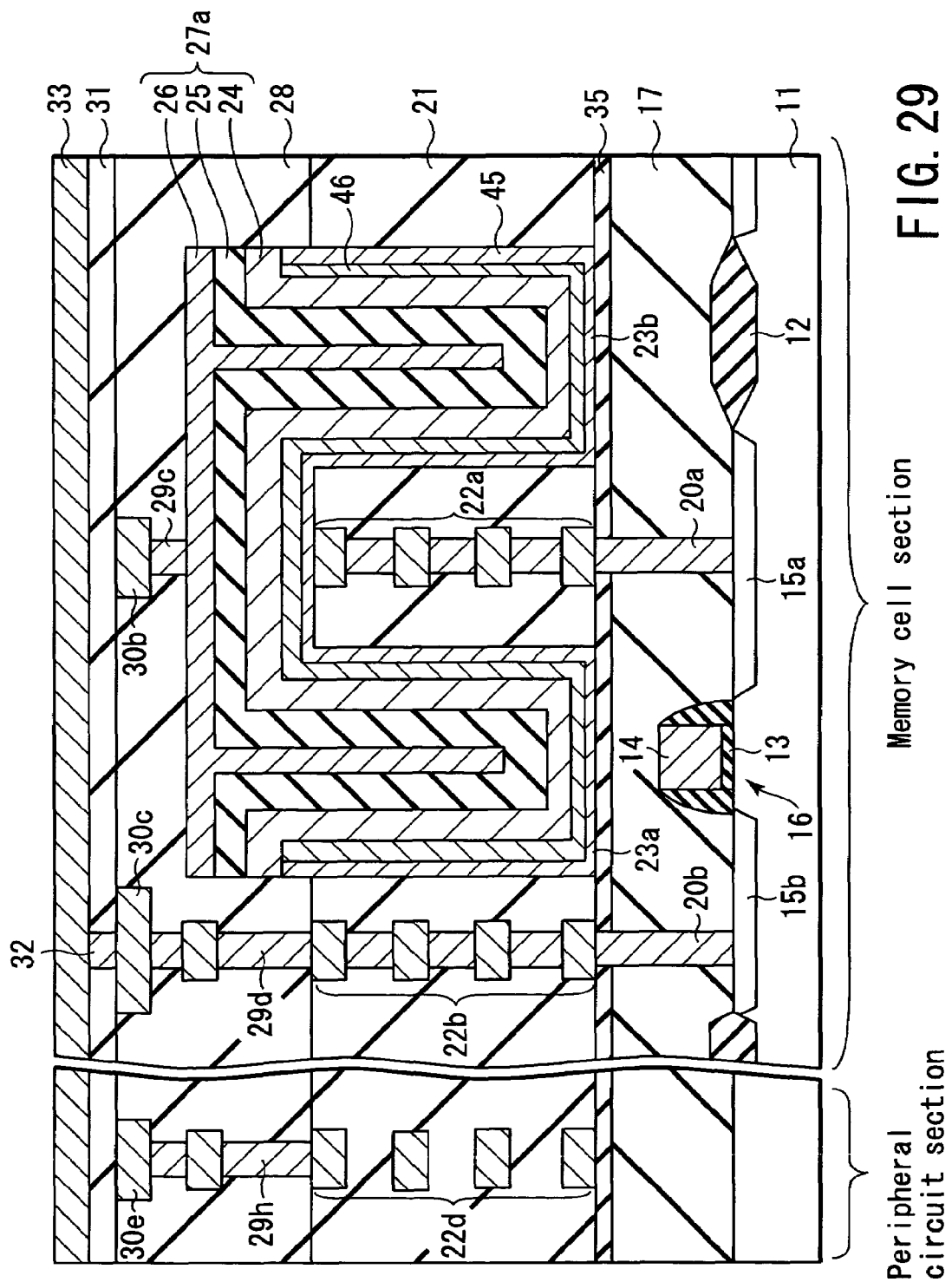
FIG. 29 is a cross-sectional view showing a semiconductor memory device of a modification example 1 according to the sixth embodiment of the present invention.

According to the modification example 1 of the sixth embodiment, a protection insulating film 35 is additionally formed under the recessed portions 23a and 23b of the basic example of the sixth embodiment, as seen from FIG. 29. The protection insulating film 35 has at least one of stopper, hydrogen barrier and oxygen barrier functions in forming the recessed portions 23a and 23b.

According to the modification example 1 of the sixth embodiment, the following effects are obtained in addition to the same effect as the basic example of the sixth embodiment. The protection insulating film 35 serves to improve the controllability of the distance between the bottom surfaces of the recessed portions 23a, 23b and the upper surface of the gate electrode 14. In addition, the protection insulating film 35 serves to obtain hydrogen and oxygen barrier effects.

[6-3] Modification Example 2

Figure 30:
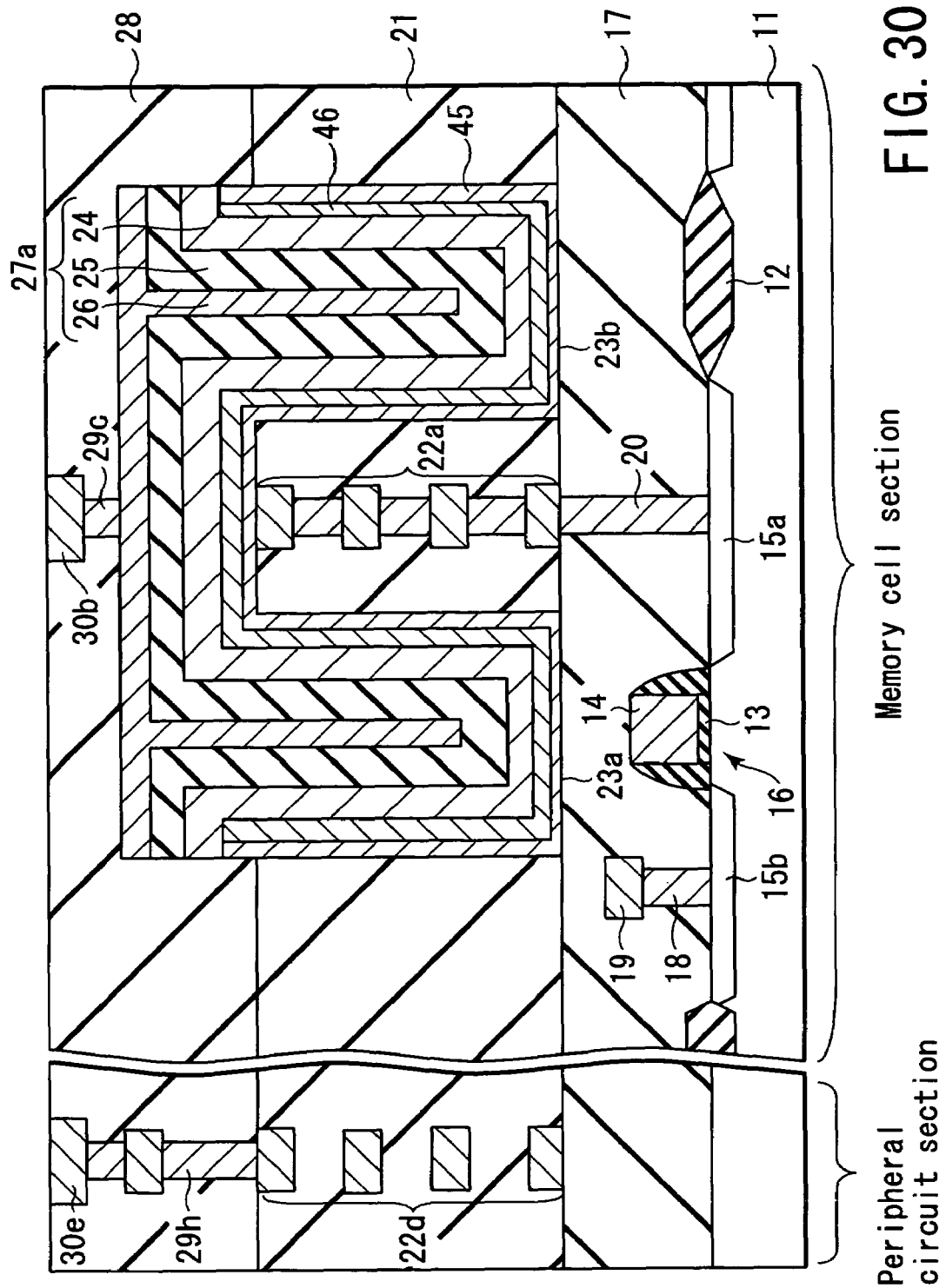
FIG. 30 is a cross-sectional view showing a semiconductor memory device of a modification example 2 according to the sixth embodiment of the present invention.

In the basic example of the sixth embodiment, the bit line 33 is arranged above the upper most surface of the capacitor 27. On the contrary, in the modification example 2 of the sixth embodiment, a bit line 19 is arranged below the bottom surface of the capacitor 27, as seen from FIG. 30.

According to the modification example 2 of the sixth embodiment, not only the same effect as the basic example of the sixth embodiment is obtained, but also there is no problem that misalignment of the capacitor 27 occurs.

[7] Seventh Embodiment

According to the seventh embodiment, the three-dimensional capacitor has COP (Capacitor On Plug) structure.

[7-1] Basic Example

Figure 31:
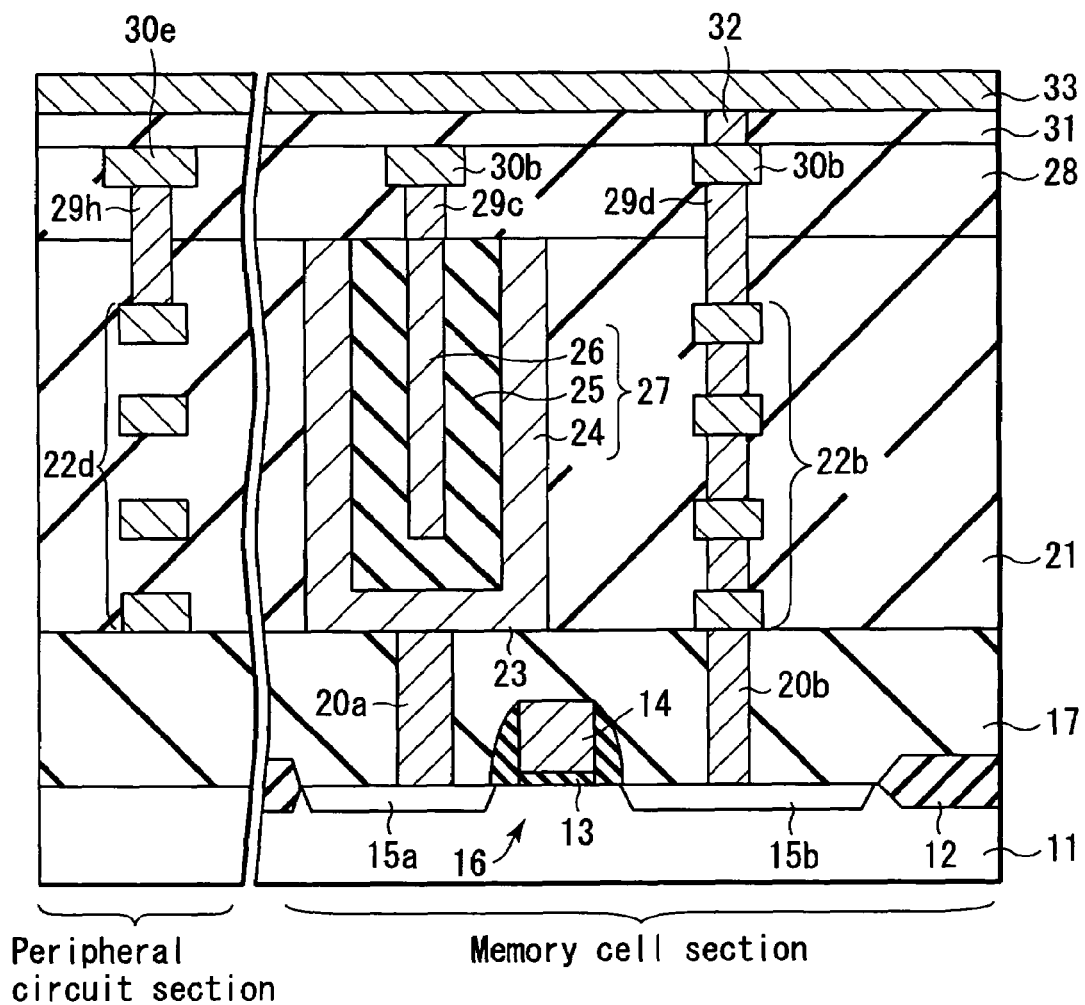
FIG. 31 is a cross-sectional view showing a semiconductor memory device of a basic example according to a seventh embodiment of the present invention.

FIG. 31 is a cross-sectional view showing a semiconductor memory device of a basic example according to a seventh embodiment of the present invention. The structure of the semiconductor memory device of the basic example according to the seventh embodiment will be described below. Here, points different from the basic structure of the first embodiment will be mainly described.

The basic example of the seventh embodiment differs from that of the first embodiment in the following point. As seen from FIG. 31, the bottom electrode 24 of the ferroelectric capacitor 27 and the source/drain diffusion layer 15a of the transistor 16 are connected via a contact 20a under the capacitor 27. In this case, the ferroelectric capacitor 27 is formed so that at least part of the capacitor 27 can be arranged above the gate electrode 14.

Figure 32:
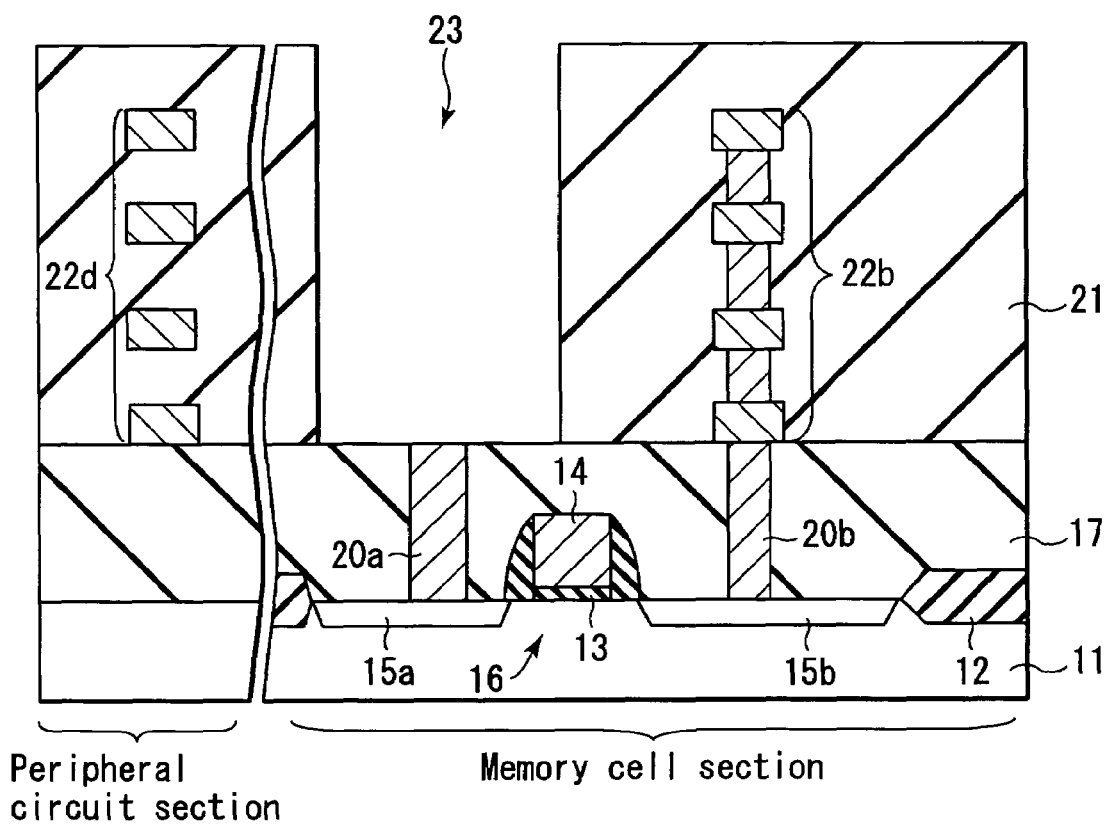
FIGS. 32 and 33 are cross-sectional views showing the process of manufacturing the semiconductor memory device of the basic example according to the seventh embodiment.
Figure 33:
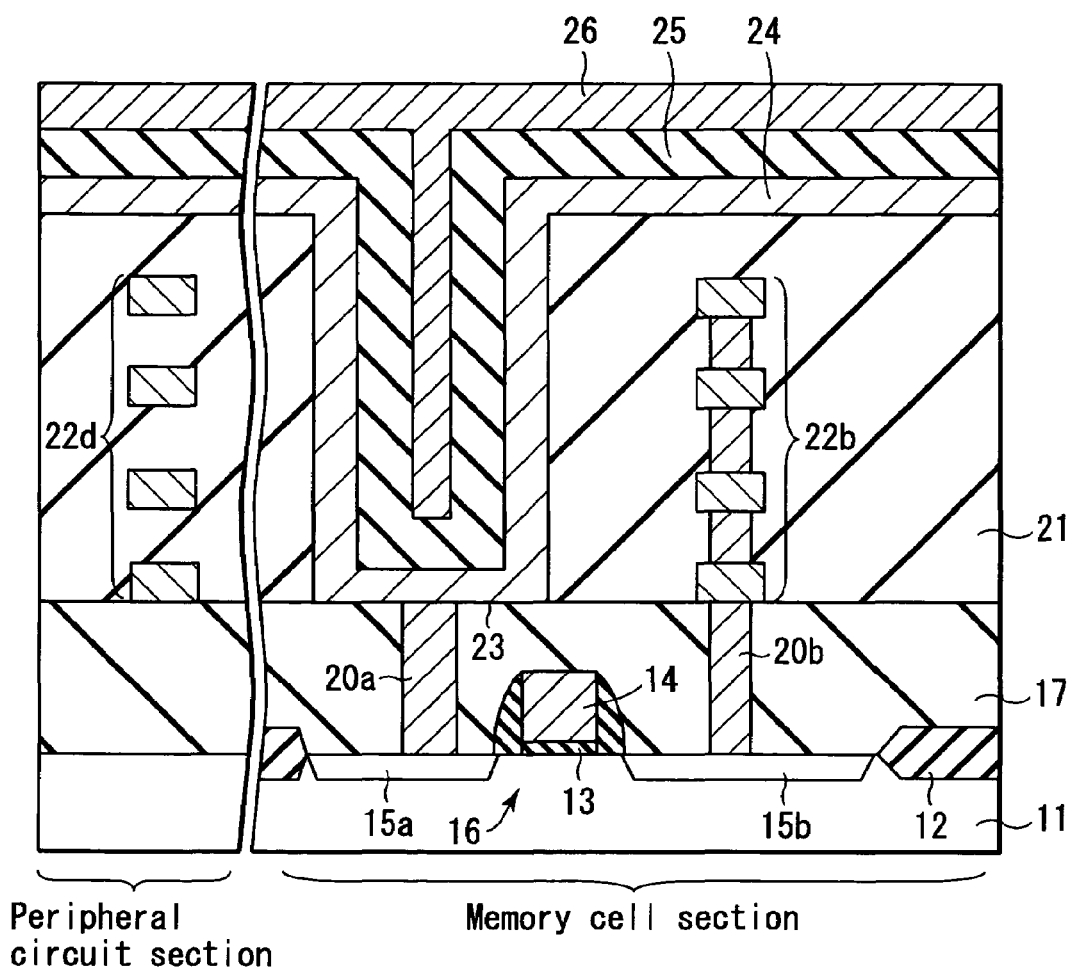

FIG. 32 and FIG. 33 are cross-sectional views showing the process of manufacturing the semiconductor memory device of the basic example according to the seventh embodiment. The following is a description on the method of forming the COP structure according to the seventh embodiment.

As shown in FIG. 32, multi-layer interconnect layers 22a and 22b consisting of materials such as W, Cu and Al are formed in the second interlayer insulating film 21 using damascene or RIE process. In this case, the multi-layer interconnect layer 22b is formed on one contact 20b connected to source/drain diffusion layers 15a and 15b; however, no multi-layer interconnect layer is formed on the other contact 20a.

The second interlayer insulating film 21 is selectively etched using RIE so that the recessed portion 23 can be formed. Forming the recessed portion 23 exposes the upper surface of the other contact 20a.

As illustrated in FIG. 33, bottom electrode 24, ferroelectric film 25 and top electrode 26 are successively deposited on the recessed portion 23 and the second interlayer insulating film 21 by CVD or sputtering process.

Thereafter, the foregoing bottom electrode 24, ferroelectric film 25 and top electrode 26 are patterned using CMP or RIE. By doing so, it is possible to realize the COP structure, which is formed with the ferroelectric capacitor 27 on the contact 20a.

According to the basic example of the seventh embodiment, the same effect as the basic example of the first embodiment is obtained.

In addition, the COP structure is employed, and thereby, the bottom electrode 24 of the capacitor 27 and the source/drain diffusion layer 15a are connected by only contact 20a without using multi-layer interconnect layers. This serves to reduce the cell area.

In addition, the COP structure optimizes the material and structure of the contact 20a independently. Therefore, it is possible to improve electrical contact of the bottom electrode with the source/drain diffusion layer 15a.

[7-2] Modification Example 1

Figure 34:
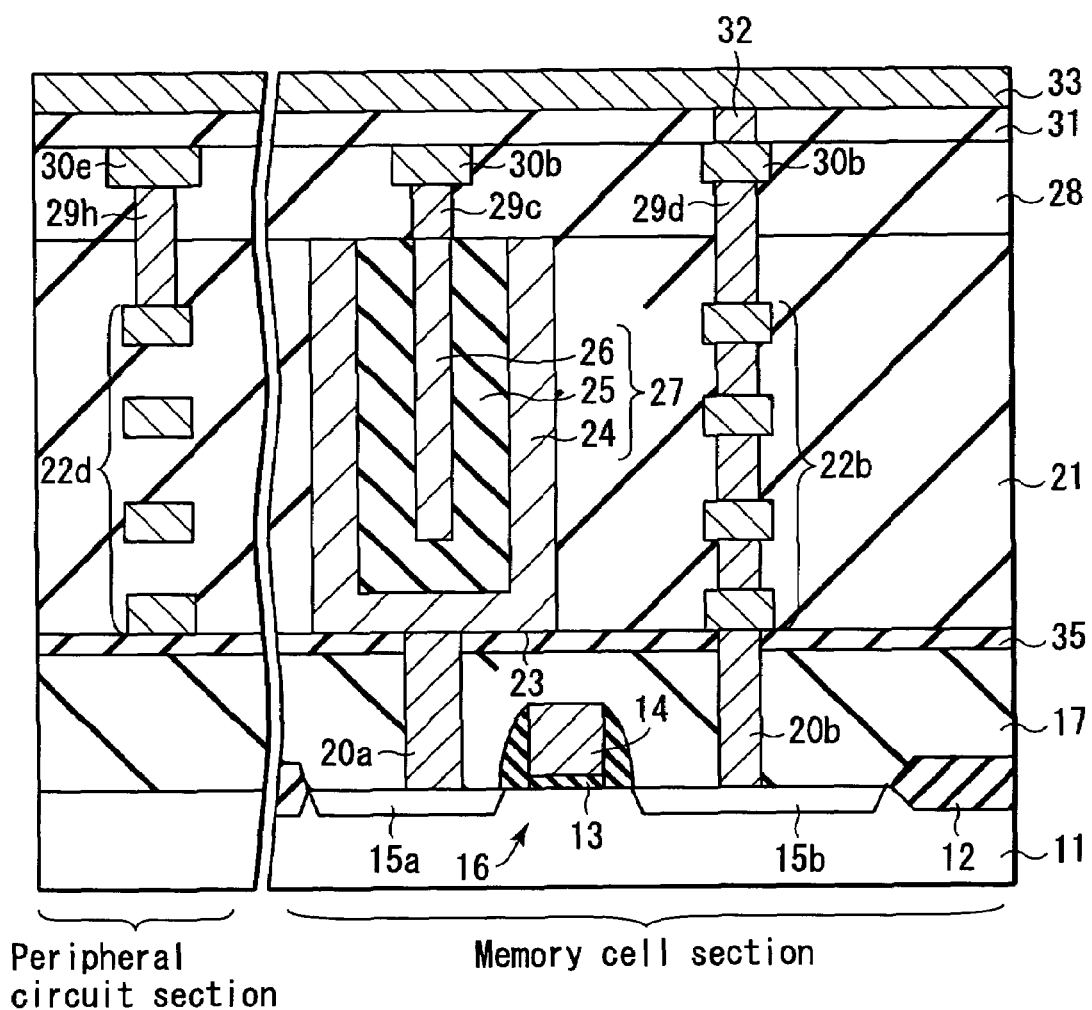
FIG. 34 is a cross-sectional view showing a semiconductor memory device of a modification example 1 according to the seventh embodiment of the present invention.

According to the modification example 1 of the seventh embodiment, a protection insulating film 35 is additionally formed under the recessed portion 23 of the basic example of the seventh embodiment, as seen from FIG. 34. The protection insulating film 35 has at least one of stopper, hydrogen barrier and oxygen barrier functions in forming the recessed portion 23.

According to the modification example 1 of the seventh embodiment, the following effects are obtained in addition to the same effect as the basic example of the seventh embodiment. The protection insulating film 35 serves to improve the controllability of the distance between the bottom surface of the recessed portion 23 and the upper surface of the gate electrode 14. In addition, the protection insulating film 35 serves to obtain hydrogen and oxygen barrier effects.

[7-3] Modification Example 2

Figure 35:
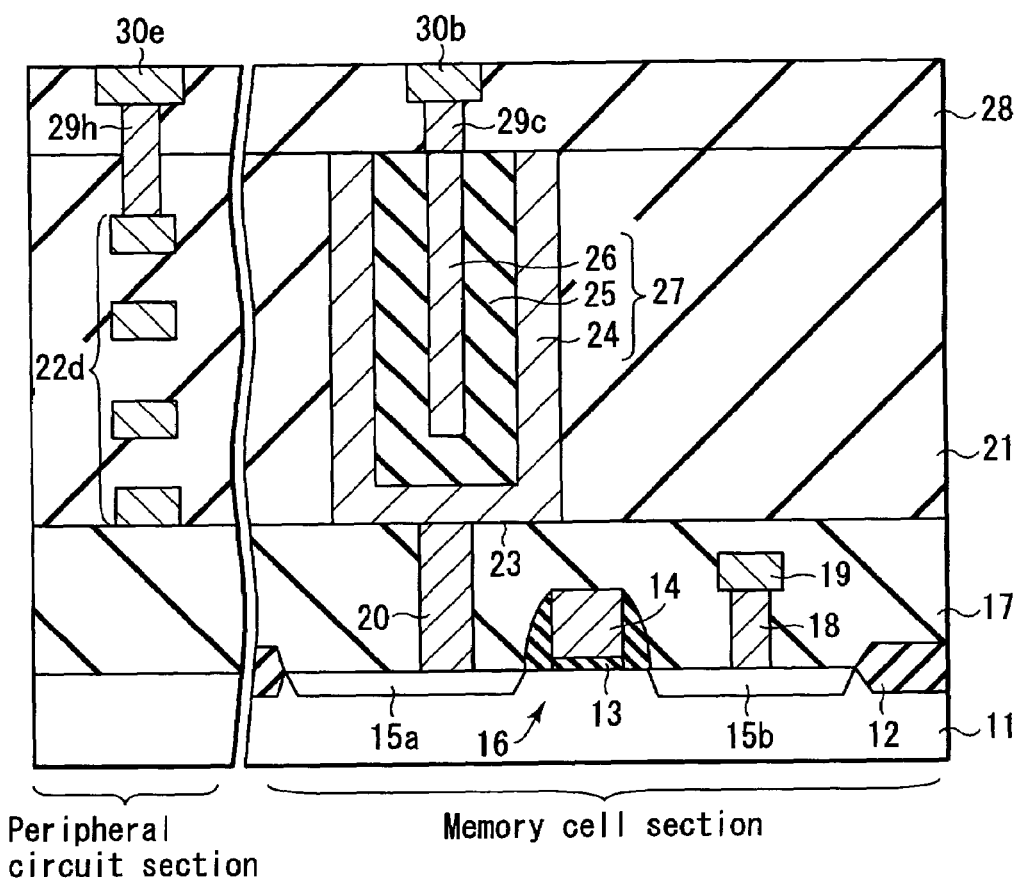
FIG. 35 is a cross-sectional view showing a semiconductor memory device of a modification example 2 according to the seventh embodiment of the present invention.

In the basic example of the seventh embodiment, the bit line 33 is arranged above the upper most surface of the capacitor 27. On the contrary, in the modification example 2 of the seventh embodiment, a bit line 19 is arranged below the bottom surface of the capacitor 27, as seen from FIG. 35.

According to the modification example 2 of the seventh embodiment, not only the same effect as the basic example of the seventh embodiment is obtained, but also there is no problem that misalignment of the capacitor 27 occurs.

[8] Eighth Embodiment

The eighth embodiment relates to a modification example of the COP structure according to the seventh embodiment. More specifically, the bottom electrode of the ferroelectric capacitor and the source/drain diffusion layer are connected without using a contact plug formed independently from the capacitor.

[8-1] Basic Example

Figure 36:
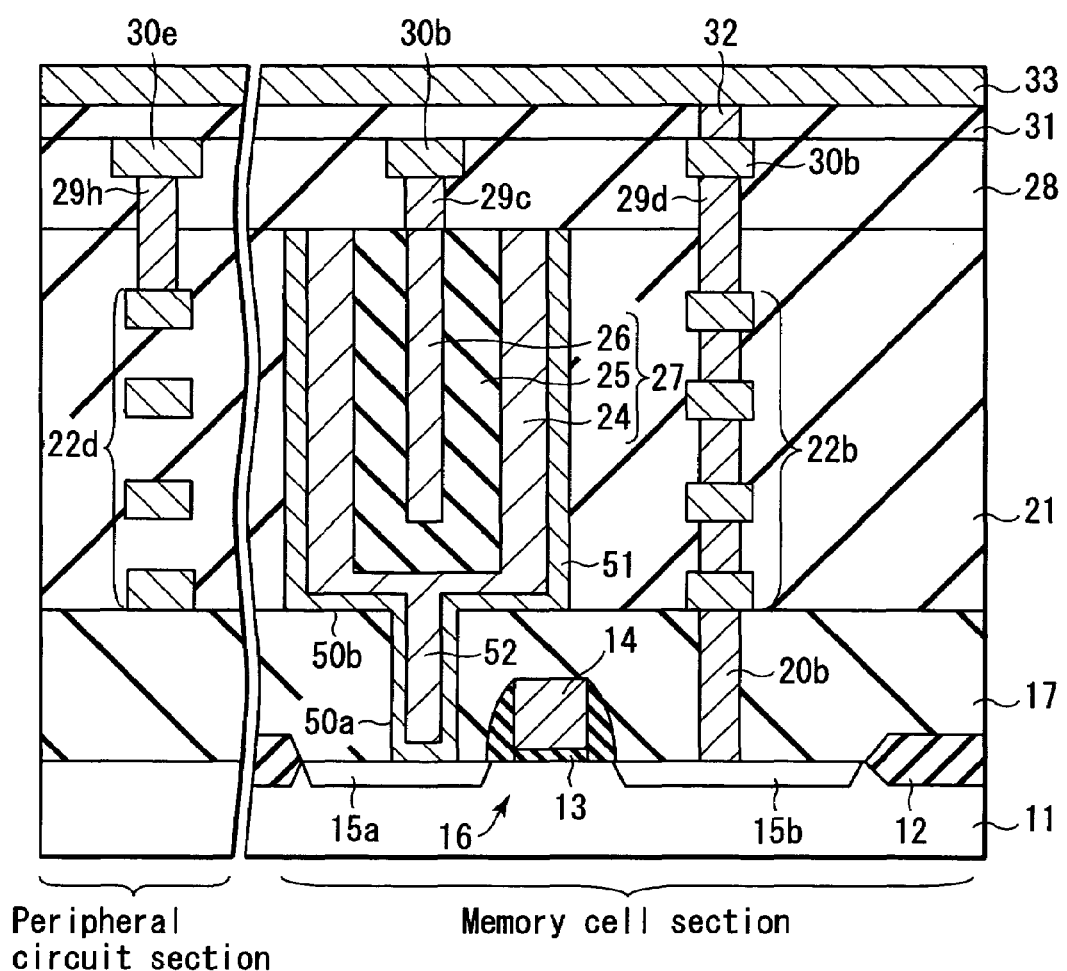
FIG. 36 is a cross-sectional view showing a semiconductor memory device of a basic example according to an eighth embodiment of the present invention.

FIG. 36 is a cross-sectional view showing a semiconductor memory device of a basic example according to an eighth embodiment of the present invention. The structure of the semiconductor memory device of the basic example according to the eighth embodiment will be described below. Here, points different from the basic structure of the seventh embodiment will be mainly described.

The basic example of the eighth embodiment differs from that of the seventh embodiment in the following point. As seen from FIG. 36, a contact 52 connecting the bottom electrode 24 of the capacitor 27 and the source/drain diffusion layer 15a is formed of part of the bottom electrode 24. The contact 52 formed of part of the bottom electrode 24 is connected directly to the source/drain diffusion layer 15a via a single- or plural-layer reaction preventing conductive film 51. In this case, the reaction preventing conductive film 51 consists of a film containing at least one of TiN, IrO$_2$ and TiAlN. In addition, the reaction preventing conductive film 51 is provided to prevent the reaction of the material of the bottom electrode 24 and the semiconductor substrate 11.

Figure 37:
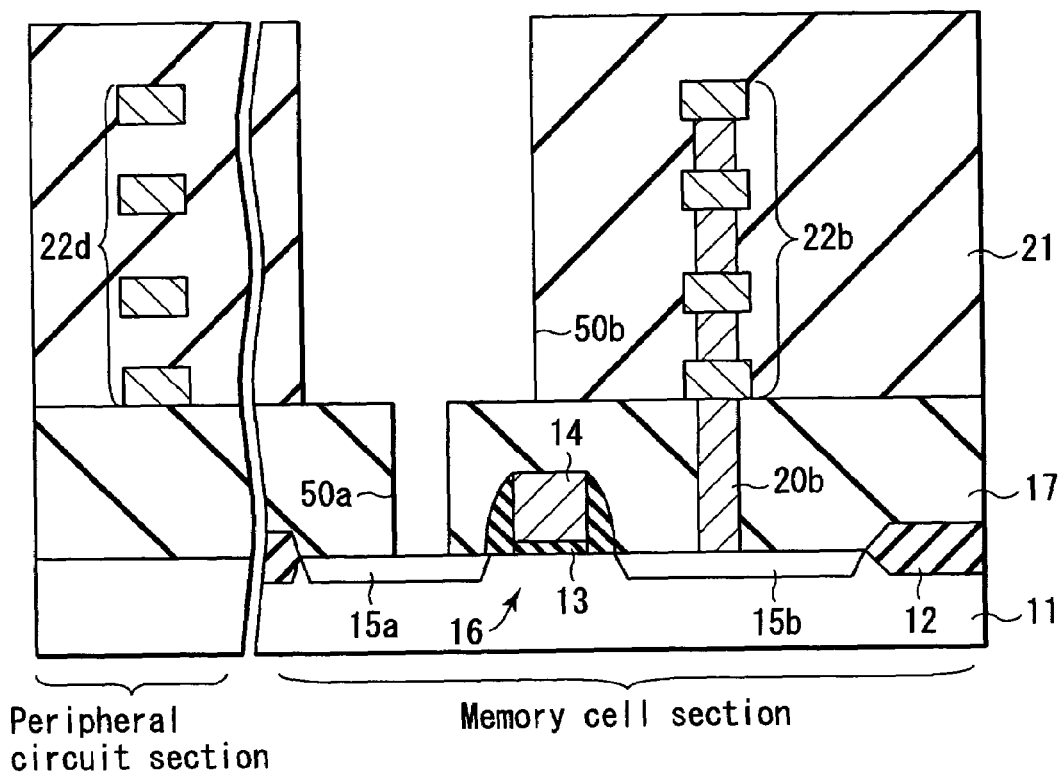
FIG. 37 and FIG. 38 are cross-sectional views showing the process of manufacturing the semiconductor memory device of the basic example according to the eighth embodiment.
Figure 38:
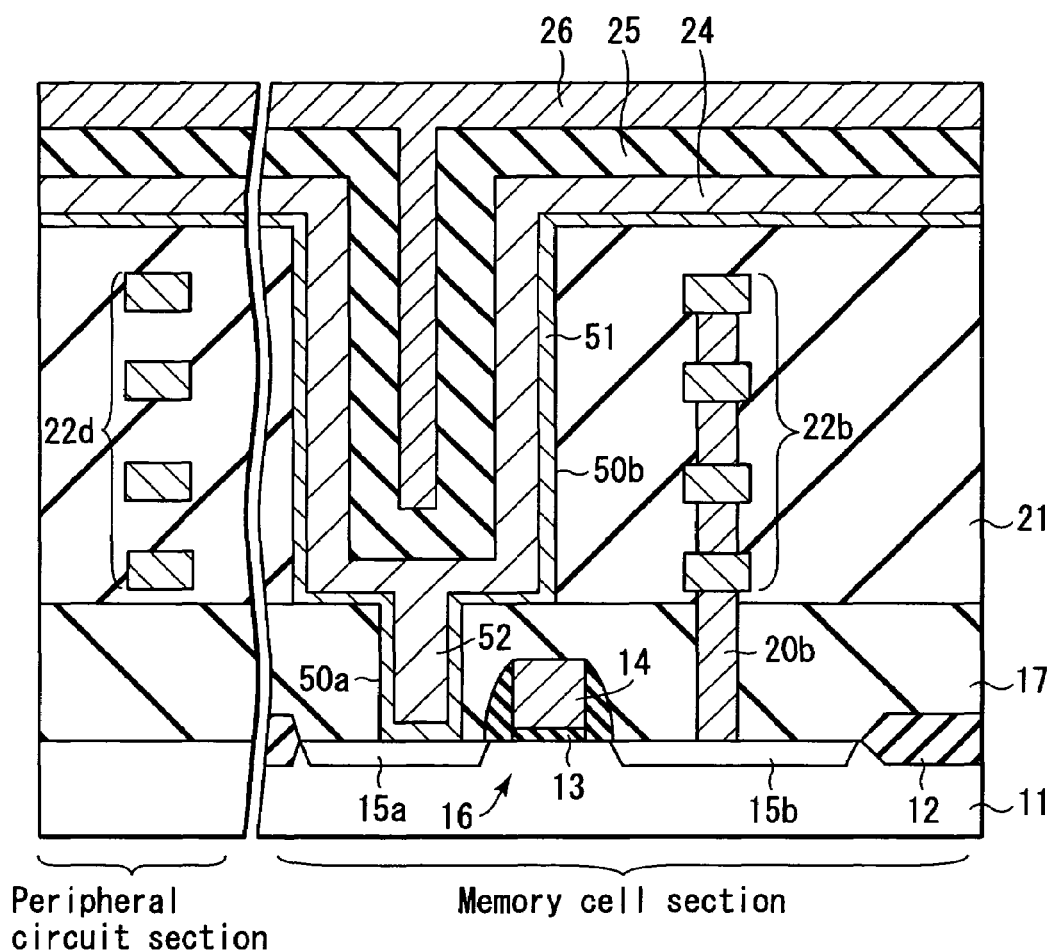

FIG. 37 and FIG. 38 are cross-sectional views showing the process of manufacturing the semiconductor memory device of the basic example according to the eighth embodiment. The following is a description on the method of forming the COP structure according to the eighth embodiment.

As shown in FIG. 37, multi-layer interconnect layers 22a and 22b consisting of materials such as W, Cu and Al are formed in the second interlayer insulating film 21 using damascene or RIE process. In this case, the multi-layer interconnect layer 22b is formed on one contact 20b connected to source/drain diffusion layers 15a and 15b; however, no multi-layer interconnect layer is formed on the other contact 20a.

The second interlayer insulating film 21 is selectively etched using RIE until the upper surface of the first interlayer insulating film 17 is exposed, and thus, a recessed portion 50b is formed. The first interlayer insulating film 17 is selectively etched from the recessed portion 50b until the upper surface of the source/drain diffusion layers 15a is exposed. By doing so, a recessed portion 50a communicating with the recessed portion 50b is formed.

As illustrated in FIG. 38, reaction preventing conductive film 51, bottom electrode 24, ferroelectric film 25 and top electrode 26 are successively deposited on the recessed portions 50a, 50b and the second interlayer insulating film 21 by CVD or sputtering process.

Thereafter, the foregoing reaction preventing conductive film 51, bottom electrode 24, ferroelectric film 25 and top electrode 26 are patterned using CMP or RIE. By doing so, it is possible to realize the modification example of the COP structure, which has the contact 52 formed of part of the ferroelectric capacitor 27.

According to the basic example of the eighth embodiment, the same effect as the basic example of the seventh embodiment is obtained.

In addition, the contact 52 connecting the bottom electrode 24 of the capacitor 27 and the source/drain diffusion layer 15a of the transistor 16 is formed of part of the bottom electrode 24. By doing so, the number of processes is further reduced as compared with the seventh embodiment, so that the process can be simplified.

[8-2] Modification Example 1

Figure 39:
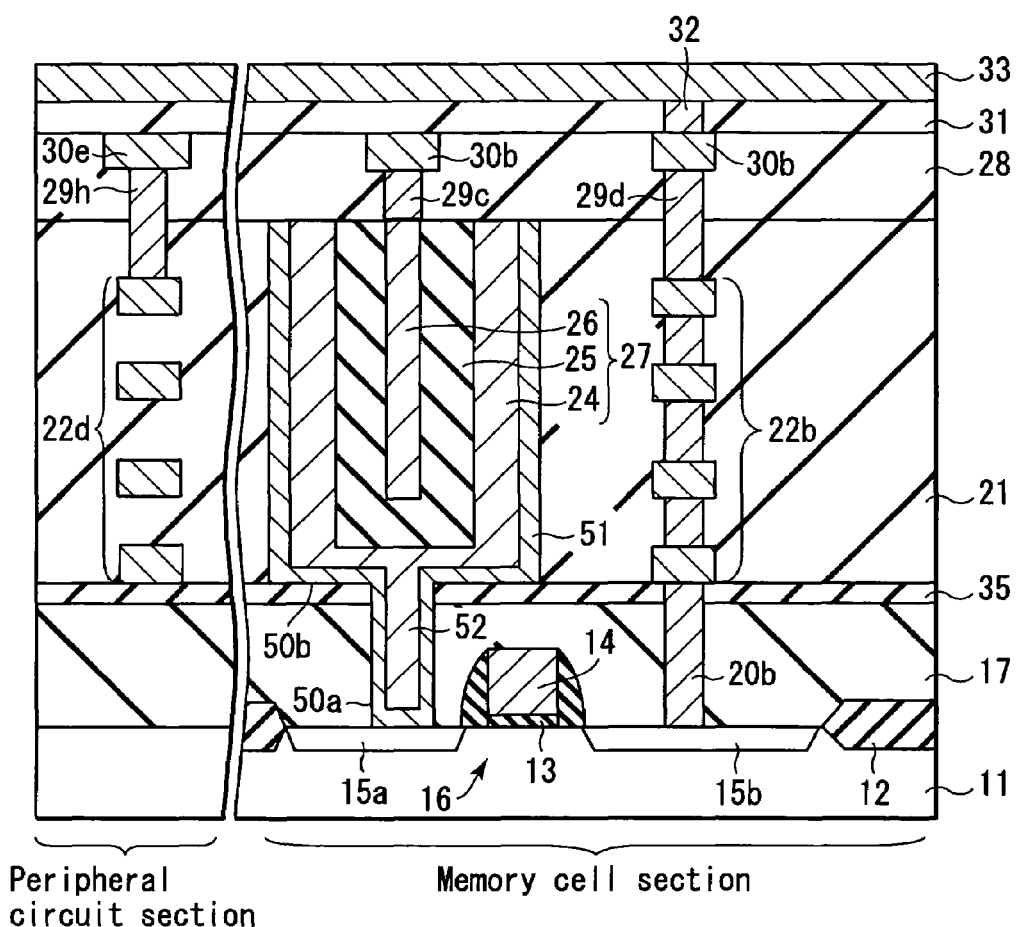
FIG. 39 is a cross-sectional view showing a semiconductor memory device of a modification example 1 according to the eighth embodiment of the present invention.

According to the modification example 1 of the eighth embodiment, a protection insulating film 35 is additionally formed under the recessed portion 50b of the basic example of the eighth embodiment, as seen from FIG. 39. The protection insulating film 35 has at least one of stopper, hydrogen barrier and oxygen barrier functions in forming the recessed portion 50b.

According to the modification example 1 of the eighth embodiment, the following effects are obtained in addition to the same effect as the basic example of the eighth embodiment. The protection insulating film 35 serves to improve the controllability of the distance between the bottom surface of the recessed portion 50b and the upper surface of the gate electrode 14. In addition, the protection insulating film 35 serves to obtain hydrogen and oxygen barrier effects.

[8-3] Modification Example 2

Figure 40:
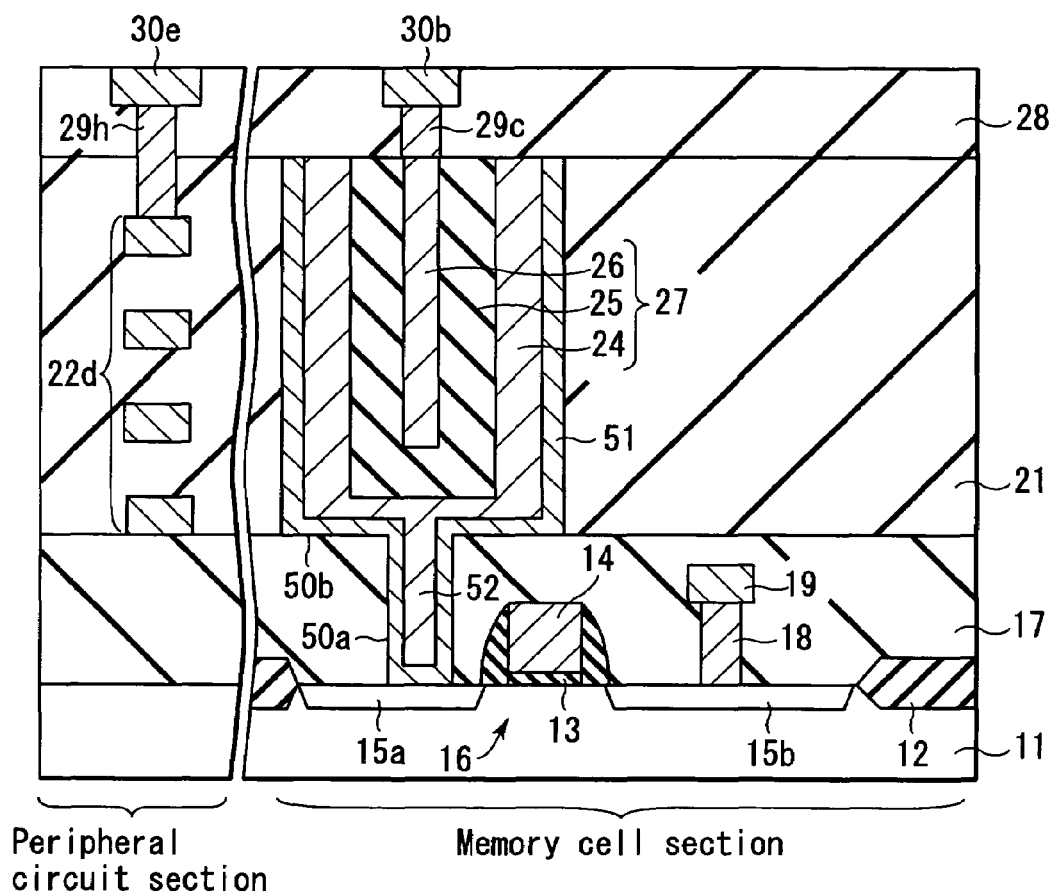
FIG. 40 is a cross-sectional view showing a semiconductor memory device of a modification example 2 according to the eighth embodiment of the present invention.

In the basic example of the eighth embodiment, the bit line 33 is arranged above the upper most surface of the capacitor 27. On the contrary, in the modification example 2 of the eighth embodiment, a bit line 19 is arranged below the bottom surface of the capacitor 27, as seen from FIG. 40.

According to the modification example 2 of the eighth embodiment, not only the same effect as the basic example of the eighth embodiment is obtained, but also there is no problem that misalignment of the capacitor 27 occurs.

[9] Ninth Embodiment

According to the ninth embodiment, hydrogen and oxygen barrier films are added to the COP structure described in the seventh embodiment.

[9-1] Basic Example

Figure 41:
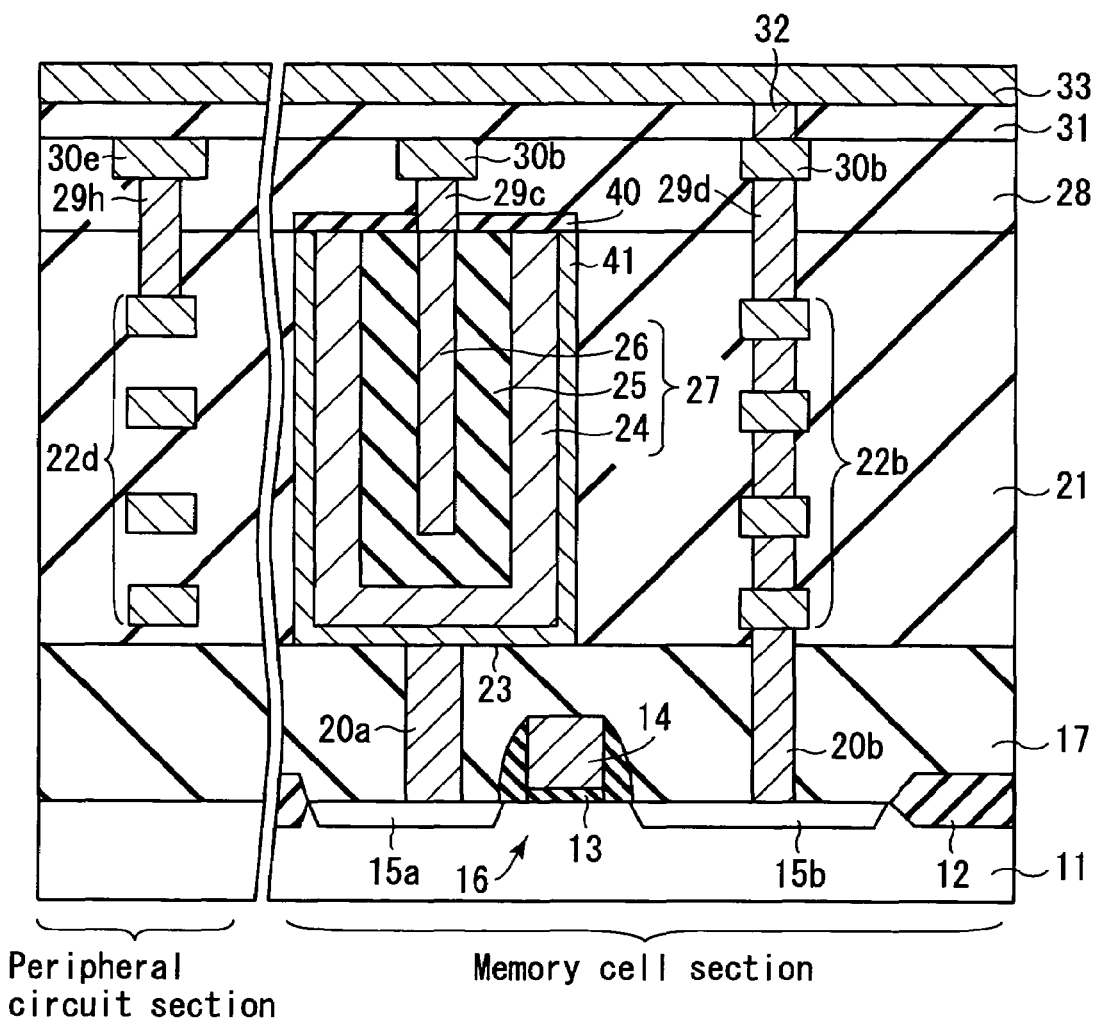
FIG. 41 is a cross-sectional view showing a semiconductor memory device of a basic example according to a ninth embodiment of the present invention.

FIG. 41 is a cross-sectional view showing a semiconductor memory device of a basic example according to a ninth embodiment of the present invention. The structure of the semiconductor memory device of the basic example according to the ninth embodiment will be described below. Here, points different from the basic structure of the seventh embodiment will be mainly described.

The ninth embodiment differs from the seventh embodiment in the following point. As seen from FIG. 41, the upper surface of the three-dimensional ferroelectric capacitor 27 is coated with a hydrogen barrier film 40 while the bottom and side surfaces thereof are coated with an oxygen barrier film 41.

In this case, the hydrogen barrier film 40 may be a single or plural layer. For example, the hydrogen barrier film 40 consists of a film containing at least one of insulating materials such as $Al_2O_3$, $TiO_2$ and SiN. The hydrogen barrier film 40 may be formed contacting directly with the capacitor 27. An insulating film is formed between the capacitor 27 and the hydrogen barrier film 40, and thereby, the capacitor 27 may be surrounded with a stacked film comprising the hydrogen barrier film 40 and the insulating film. The hydrogen barrier film 40 may be formed between the oxygen barrier film 41 and the bottom electrode 24 like the fourth embodiment, in addition to the upper surface of the three-dimensional ferroelectric capacitor 27.

The oxygen barrier film 41 may be a single or plural layer. For example, the oxygen barrier film 41 consists of a film containing at least one of conductive materials such as TiAlN.

If the oxygen barrier film 41 is formed of conductive materials, the following process is carried out. The oxygen barrier film 41 is formed on the interlayer insulating film 21 in addition to the bottom and side surfaces of the recessed portion 23. Annealing is carried out after the capacitor 27 is formed. Thereafter, the hydrogen barrier film 40 is formed, and the oxygen barrier film 41 on the interlayer insulating film 21 is removed. The process described above is carried out, and thereby, interconnects such as multi-layer interconnect layers 22b are coated with the oxygen barrier film 41 in annealing. Therefore, the oxygen barrier film 41 can prevent interconnects such as multi-layer interconnect layers 22b from being oxidized.

The oxygen barrier film 41 may be formed insulating materials. In this case, the oxygen barrier film 41 may be formed on the interlayer insulating film 21 in addition to the bottom and side surfaces of the recessed portion 23. However, in order to conduct the bottom electrode 24 and the contact 20a, part of the oxygen barrier film 41 on the bottom surface of the recessed portion 23 must be removed to contact the bottom electrode 24 with the contact 20a. If the hydrogen barrier film 40 is formed on the bottom and side surfaces of the capacitor 27, part of the oxygen barrier film 41 must be removed to contact the bottom electrode 24 with the contact 20a, like the oxygen barrier film 41.

According to the basic example of the ninth embodiment, the same effect as that of the seventh embodiment is obtained.

In addition, it is possible to simultaneously prevent oxidization of interconnects such as multi-layer interconnect layers 22b and degradation of the capacitor 27 by hydrogen. Therefore, the capacitor 27 durable to process degradation can be formed.

[9-2] Modification Example 1

Figure 42:
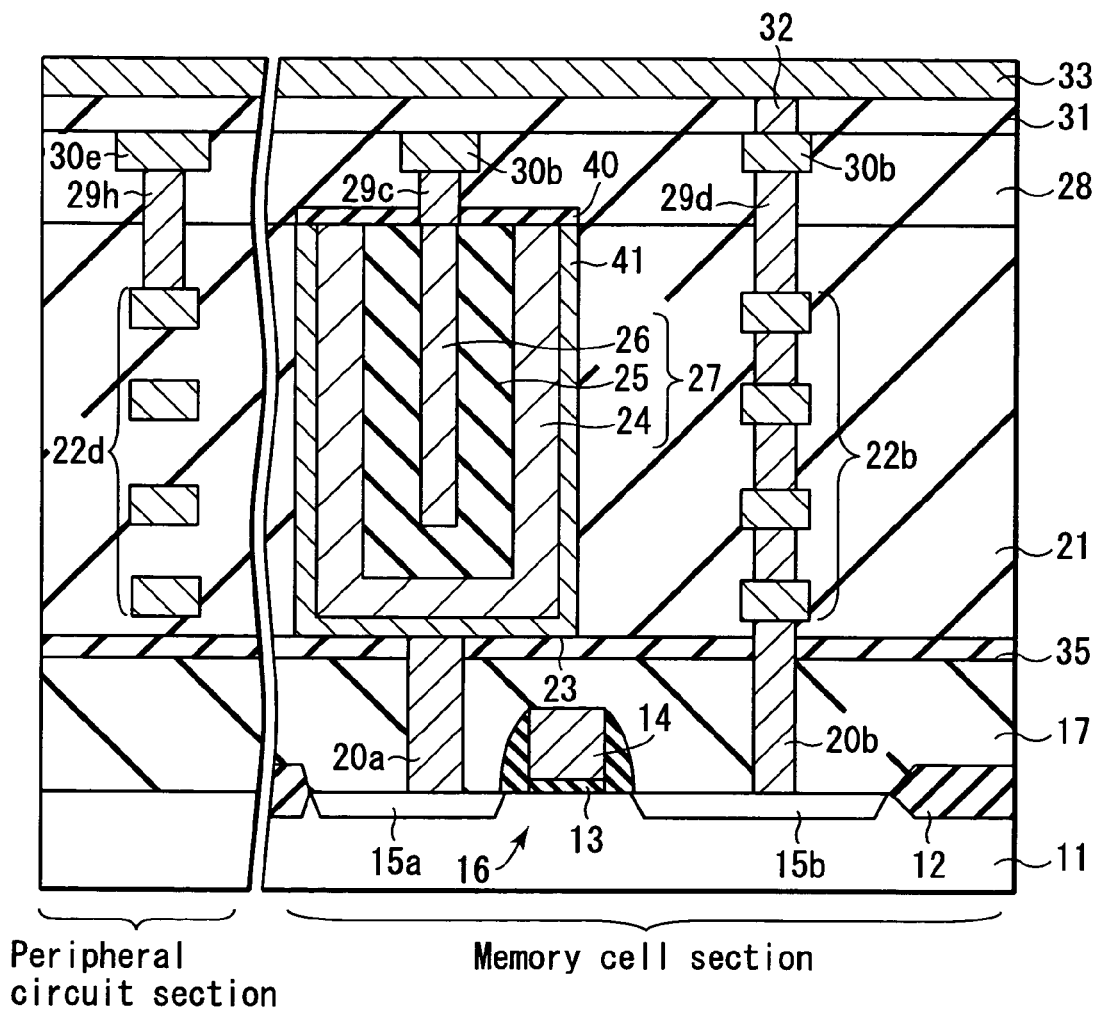
FIG. 42 is a cross-sectional view showing a semiconductor memory device of a modification example 1 according to the ninth embodiment of the present invention.

According to the modification example 1 of the ninth embodiment, a protection insulating film 35 is additionally formed under the recessed portion 23 of the basic example of the ninth embodiment, as seen from FIG. 42. The protection insulating film 35 has at least one of stopper, hydrogen barrier and oxygen barrier functions in forming the recessed portion 23.

According to the modification example 1 of the ninth embodiment, the following effects are obtained in addition to the same effect as the basic example of the ninth embodiment. The protection insulating film 35 serves to improve the controllability of the distance between the bottom surface of the recessed portion 23 and the upper surface of the gate electrode 14. In addition, the protection insulating film 35 serves to obtain hydrogen and oxygen barrier effects.

[9-3] Modification Example 2

Figure 43:
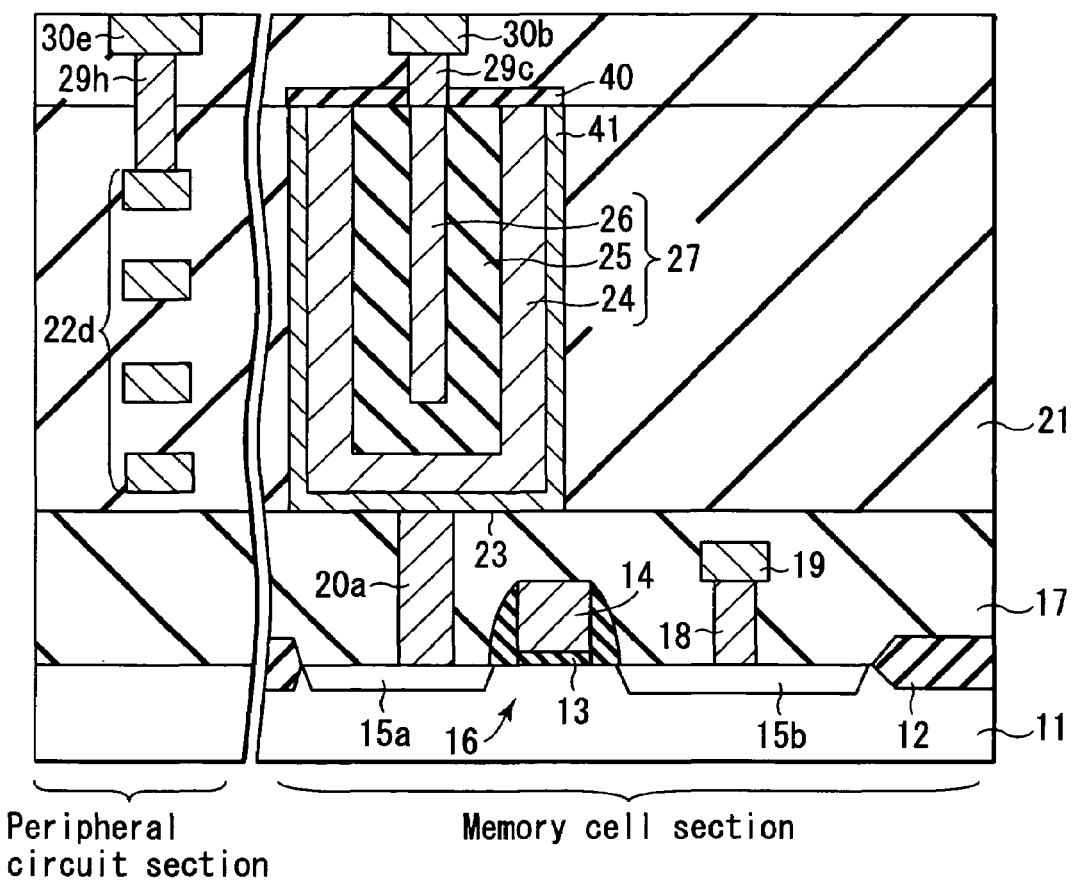
FIG. 43 is a cross-sectional view showing a semiconductor memory device of a modification example 2 according to the ninth embodiment of the present invention.

In the basic example of the ninth embodiment, the bit line 33 is arranged above the upper most surface of the capacitor 27. On the contrary, in the modification example 2 of the ninth embodiment, a bit line 19 is arranged below the bottom surface of the capacitor 27, as seen from FIG. 43.

According to the modification example 2 of the ninth embodiment, not only the same effect as the basic example of the ninth embodiment is obtained, but also there is no problem that misalignment of the capacitor 27 occurs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   a transistor formed on the semiconductor substrate, and having a gate electrode and first and second diffusion layers;
   a first insulating film formed on the transistor;
   a first multi-layer interconnect layer formed in the first insulating film, and including a plurality of interconnect layers and contacts;
   a first recessed portion formed to continuously and vertically penetrate the first insulating film including at least two layers of the first multi-layer interconnect layer, and arranged so that at least part of the first recessed portion overlaps with the gate electrode; and
   a ferroelectric capacitor three-dimensionally formed in the first recessed portion, and having first and second electrodes and a ferroelectric film, the first electrode being electrically connected with the first diffusion layer,
   the ferroelectric capacitor comprising a first portion which is formed at a bottom of the first recessed portion and is extended horizontal to the semiconductor substrate, and a second portion which is formed on a side wall of the first recessed portion and is extended vertical to the semiconductor substrate.

2. The device according to claim 1, wherein the first electrode is electrically connected with the first diffusion layer via the first multi-layer interconnect layer.

3. The device according to claim 1, further comprising:
a second multi-layer interconnect layer formed in the first insulating film, electrically connected with the second diffusion layer, and including a plurality of interconnect layers and contacts; and
a bit line electrically connected with the second multi-layer interconnect layer, and arranged above the ferroelectric capacitor.

4. The device according to claim 1, wherein an aspect ratio of the first recessed portion is 1.

5. The device according to claim 1, wherein an aspect ratio of the first recessed portion is 4 to 5.

6. The device according to claim 1, wherein a peripheral circuit section arranged on the periphery of a memory cell section which includes the transistor and the ferroelectric capacitor, the peripheral circuit section comprises a second multi-layer interconnect layer formed on a surface identical to the first multi-layer interconnect layer in the first insulating film, and including a plurality of interconnect layers and contacts.

7. The device according to claim 1, further comprising:
a second insulating film formed under a bottom surface of the first recessed portion, and having at least one of stopper, hydrogen barrier and oxygen barrier functions.

8. The device according to claim 1, further comprising:
a first contact electrically connected with the second diffusion layer; and
a bit line electrically connected with the first contact, and arranged below the ferroelectric capacitor.

9. The device according to claim 1, further comprising:
a single- or plural-layer hydrogen barrier film formed to coat at least part of the side, bottom and upper surfaces of the ferroelectric capacitor.

10. The device according to claim 9, wherein the hydrogen barrier film has a first part formed at the side and bottom surfaces of the ferroelectric capacitor, and a second part formed on the upper surfaces of the ferroelectric capacitor,
the first part is formed of a conductive or insulating material, and the second part is formed of an insulating film.

11. The device according to claim 1, further comprising:
a single- or plural-layer oxygen barrier film continuously formed under the first electrode in the first recessed portion and on the first insulating film.

12. The device according to claim 1, further comprising:
a single- or plural-layer oxygen barrier film formed on the side and bottom surfaces of the first recessed portion and on the first insulating film; and
a single- or plural-layer hydrogen barrier film formed between the oxygen barrier film and the first electrode and formed to coat at least part of an upper surface of the ferroelectric capacitor.

13. The device according to claim 1, wherein the first electrode contacts with an uppermost-layer interconnect of the first multi-layer interconnect layer via a single- or plural-layer reaction preventing conductive film.

14. The device according to claim 13, wherein a contact surface of the uppermost-layer interconnect and the first electrode is a flat or concavo-concave surface.

15. The device according to claim 1, further comprising:
a first contact formed on the first diffusion layer and under the ferroelectric capacitor, and electrically connected with the first diffusion layer and the first electrode.

16. The device according to claim 1, wherein a contact formed of part of the first electrode is electrically connected with the first diffusion layer.

17. The device according to claim 1, wherein a contact formed of part of the first electrode is electrically connected with the first diffusion layer via a single- or plural-layer reaction preventing conductive film.

18. The device according to claim 1, further comprising:
a single- or plural-layer oxygen barrier film formed on at least side and bottom surfaces of the first recessed portion;
a single- or plural-layer hydrogen barrier film formed between the oxygen barrier film and the first electrode and formed to coat at least part of an upper surface of the ferroelectric capacitor;
a first contact formed on the first diffusion layer and under the ferroelectric capacitor, and electrically connected with the first diffusion layer and the oxygen barrier film.

19. The semiconductor memory device according to claim 1, wherein the first electrode is a bottom electrode, and the second electrode is a top electrode,
the semiconductor memory device further comprising:
a first contact formed above the ferroelectric capacitor and connected with the first electrode and the first multi-layer interconnect layer; and
a second contact formed above the ferroelectric capacitor, connected with the second electrode, and being at a same level as the first contact.

20. A semiconductor memory device comprising:
a semiconductor substrate;
a first transistor formed on the semiconductor substrate, and having a first gate electrode, first and second diffusion layers;
a second transistor formed on the semiconductor substrate, and having a second gate electrode, second and third diffusion layers;
a first insulating film formed on the first and second transistor;
first to third multi-layer interconnect layers formed in the first insulating film, and including a plurality of interconnect layers and contacts;
a first recessed portion formed to continuously and vertically penetrate the first insulating film including at least two layers of the first to third multi-layer interconnect layer, and arranged so that at least part of the first recessed portion overlaps with the first gate electrode;
a second recessed portion formed to continuously and vertically penetrate the first insulating film including at least two layers of the first to third multi-layer interconnect layer, and arranged so that at least part of the second recessed portion overlaps with the second gate electrode;
a first ferroelectric capacitor three-dimensionally formed in the first recessed portion, and having first and second electrodes and a first ferroelectric film, the first electrode being electrically connected with the first diffusion layer via the first multi-layer interconnect layer, the first ferroelectric capacitor comprising a first portion which is formed at a bottom of the first recessed portion and is extended horizontal to the semiconductor substrate, and a second portion which is formed on a side of the first recessed portion and is extended vertical to the semiconductor substrate; and
a second ferroelectric capacitor three-dimensionally formed in the second recessed portion, and having third and fourth electrodes and a second ferroelectric film, the third electrode being electrically connected with the third diffusion layer via the third multi-layer interconnect layer, the second and fourth electrodes being electrically connected with the second diffusion layer via the second multi-layer interconnect layer, the second ferroelectric capacitor comprising a third portion which is formed at a bottom of the second recessed portion and is extended horizontal to the semiconductor substrate, and a fourth portion which is formed on a side of the second recessed portion and is extended vertical to the semiconductor substrate.

21. The semiconductor memory device according to claim 20, wherein the first electrode and the third electrode are bottom electrodes, and the second electrode and the fourth electrode are top electrodes, the semiconductor memory device further comprising:

a first contact formed above the first ferroelectric capacitor and connected with the first electrode and the first multilayer interconnect layer;

a second contact formed above the first ferroelectric capacitor, connected with the second electrode, and being at a same level as the first contact;

a third contact formed above the second ferroelectric capacitor, connected with the third electrode and the second multi-layer interconnect layer, and being at a same level as the first contact; and a fourth contact formed above the first ferroelectric capacitor, connected with the fourth electrode, and being at a same level as the first contact.

* * * * *